United States Patent [19]

Yano et al.

[11] Patent Number: 5,437,961
[45] Date of Patent: Aug. 1, 1995

[54] METHOD OF MANUFACTURING SEMICONDUCTOR DEVICE

[75] Inventors: Hiroyuki Yano, Yokohama; Haruo Okano, Tokyo; Tohru Watanabe, Yokohama; Keiji Horioka, Kawasaki, all of Japan

[73] Assignee: Kabushiki Kaisha Toshiba, Kawasaki, Japan

[21] Appl. No.: 263,415

[22] Filed: Jun. 21, 1994

Related U.S. Application Data

[63] Continuation of Ser. No. 799,440, Nov. 27, 1991, abandoned.

[30] Foreign Application Priority Data

Nov. 27, 1990 [JP] Japan .................. 2-320885
Aug. 26, 1991 [JP] Japan .................. 3-213851
Nov. 12, 1991 [JP] Japan .................. 3-296045
Nov. 12, 1991 [JP] Japan .................. 3-296074

[51] Int. Cl.⁶ .............................................. G03F 7/00
[52] U.S. Cl. ........................... 430/316; 430/313; 430/317; 430/318; 430/950; 156/643.1
[58] Field of Search ............. 430/311, 313, 314, 316, 430/317, 318, 271, 275, 523, 524, 950; 156/643, 659.1, 660

[56] References Cited

U.S. PATENT DOCUMENTS

| | | | |
|---|---|---|---|
| 4,620,898 | 11/1986 | Banks et al. | 156/643 |
| 4,704,342 | 11/1987 | Lehrer | 430/5 |
| 4,820,611 | 4/1989 | Arnold | 430/311 |
| 4,904,338 | 2/1990 | Kozicki | 156/628 |
| 4,975,144 | 12/1990 | Yamazaki et al. | 156/643 |
| 5,022,959 | 6/1991 | Itoh et al. | 156/643 |
| 5,102,498 | 4/1992 | Itoh et al. | 156/659.1 |
| 5,240,554 | 8/1993 | Hori et al. | 156/643 |

FOREIGN PATENT DOCUMENTS

| | | |
|---|---|---|
| 0285129 | 10/1988 | European Pat. Off. . |
| 3428565 | 3/1985 | Germany . |
| 58-212136 | 12/1983 | Japan . |
| 60-117723 | 6/1985 | Japan . |
| 60-119731 | 6/1985 | Japan . |
| 60-235426 | 11/1985 | Japan . |
| 62-136025 | 6/1987 | Japan . |
| 62-136820 | 6/1987 | Japan . |
| 63-76438 | 4/1988 | Japan . |
| 1439153 | 6/1976 | United Kingdom . |
| 2129217 | 5/1984 | United Kingdom . |

OTHER PUBLICATIONS

1990 Dry Process Symposium; pp. 105–109, 1990, T. Ohiwa, et al., "SiO$_2$ Tapered Etching Employing Magnetron Discharge".

Solid State Technology; Apr. 1985; pp. 243–246; M. L. Hill, et al; "Advantages of Magnetron Etching".

Japanese Journal of Applied Physics; vol. 29, No. 10; Oct. 1990; pp. 2229–2235; K. Ono, et al.; "Plasma Chemical View of Magnetron and Reactive Ion Etching of Si with CL2".

Solid State Technology; Feb. 1988; pp. 67–71; R. R. Burke, et al.; "Microwave Multipolar Plasma for Etching and Deposition".

(List continued on next page.)

*Primary Examiner*—Kathleen Duda
*Attorney, Agent, or Firm*—Oblon, Spivak, McClelland, Maier, & Neustadt

[57] ABSTRACT

A method of manufacturing a semiconductor device is disclosed. The method comprises the steps of forming carbon layer on a light-reflective layer or a transparent layer formed on a light-reflective layer, forming a photosensitive resin layer on the carbon layer, selectively radiating light on the photosensitive resin layer, forming a photosensitive resin pattern by developing the photosensitive resin layer selectively irradiated with the light, forming a carbon pattern by etching the carbon layer using the photosensitive pattern as a mask, and forming a light-reflective pattern or a transparent layer pattern by etching the light-reflective layer using the photosensitive resin layer or the carbon pattern as a mask. When the light-reflective layer pattern is formed, the thickness of the carbon layer is set to be less than 100 nm. When the transparent layer pattern is formed, the thickness of the carbon layer is set to be 80 nm or more.

18 Claims, 42 Drawing Sheets

OTHER PUBLICATIONS

J. Vac. Sci. Technol. B6(6); Nov./Dec. 1988; pp. 1626–1631; Jin–Zhong Yu; "High–Rate Ion Etching of GaAs and Si at Low Ion Energy By Using An Electron Beam Excited Plasma System".

J. Vac. Sci. Technol. B6(1); Jan./Feb. 1988; pp. 284–287; R. Lossy, et al; "Characterization of a Reactive Broad Beam Radio–Frequency Ion Source".

Japanese Journal of Applied Physics; vol. 28, No. 11; Nov. 1989; pp. 2363–2367; S. Noda et al.; "MOS Gate Etching Using an Advanced Magnetron Etching System".

Appl. Phys. Lett. 55(2); Jul. 10, 1989; pp. 148–150; A. J. Perry, et al; "Fast Anisotropic Etching of Silicon in an Inductively Coupled Plasma Reactor".

Toshiba Review No. 143; Spring 1983; pp. 31–35; H. Ohano, et al.; "High–Rate Reactive Ion Etching Technology".

J. Appl. Phys. 65(2); Jan. 15, 1989; pp. 464–467; M. J. Cooke; "Anisotropy Control in $CF_4$ Microwave Plasma Etching".

IBM Technical Disclosure Bulletin; vol. 27, No. 7A; Dec. 1984; p. 4102; K. L. Holland, et al; "Polymide Adhesion to Pre–Treated Silicon Nitride Surfaces".

J. Vac. Sci. Technol. A4(3); May/Jun. 1986; pp. 698–699; V. Vukanovic, et al; "Summary Abstract: Polyimide Etching and Passivation Downstream of an O2–CF4–AR Microwave Plasma".

Japan Institute of Invention and Innovation, Journal of Technical Disclosure No. 78–2427.

J. Electrochem. Soc., vol. 136, No. 4, Apr. 1989, pp. 1181–1185, T. R. Pampalone, et al., "Improved Photoresist Patterning over Reflective Topographies using Titanium Oxynitride Antireflection Coatings".

J. Appl. Phys., vol. 50, No. 3, Mar. 1979, pp. 1212–1214, H. A. M. Van Den Berg, et al., "Antireflection Coatings on Metal Layers for Photolithographic Purposes".

IBM Technical Disclosure Bulletin, vol. 30, No. 10, Mar. 1988, pp. 402–406, "Carbonized Resist as Directly–Patternable Mask Absorber".

Fiz Technik Datenbank Frankfurt, Abstract AN 2605230, "Hard Carbon Coatings for IR Optical and Heavy Duty Applications".

Journal of Technical Disclosure No. 78–2427, vol. 3–12, 1978.12.20.

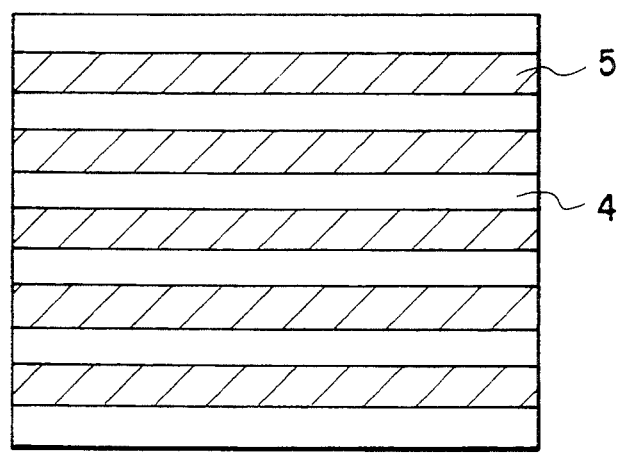
F I G. 5A
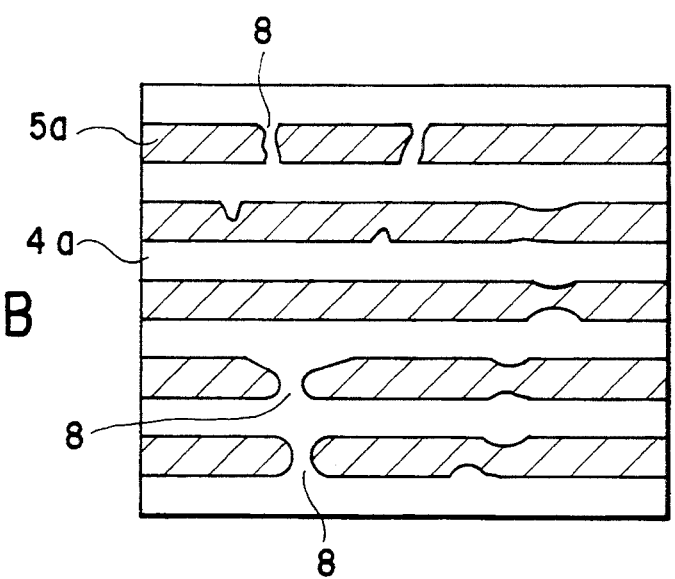
F I G. 5B

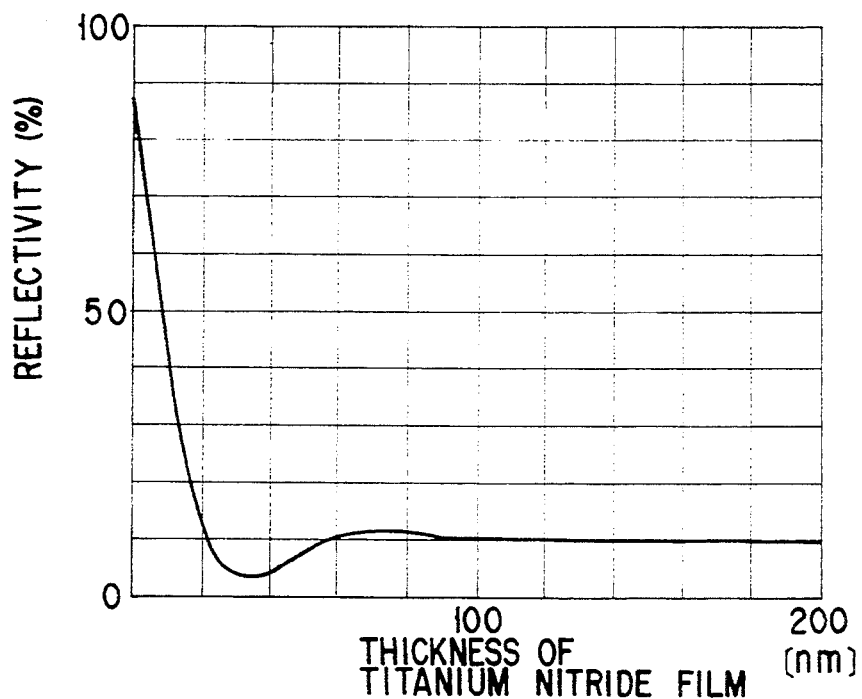
F I G. 6
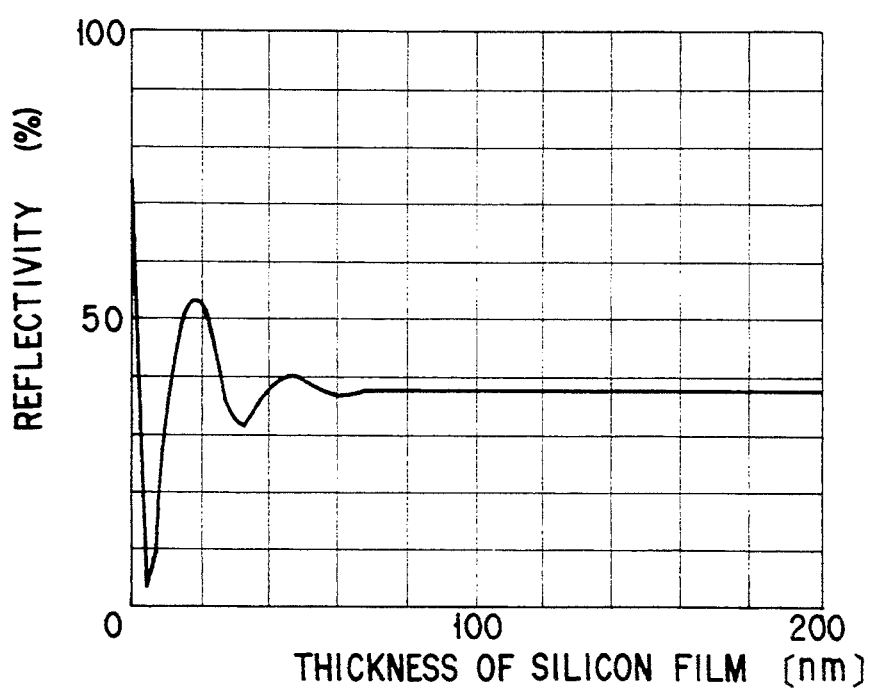
F I G. 7

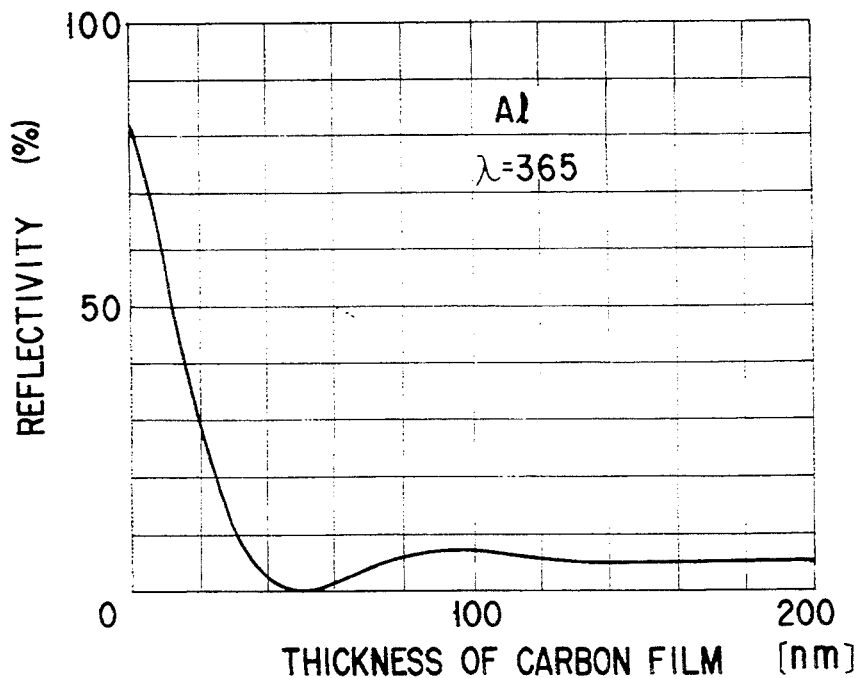
F I G. 8
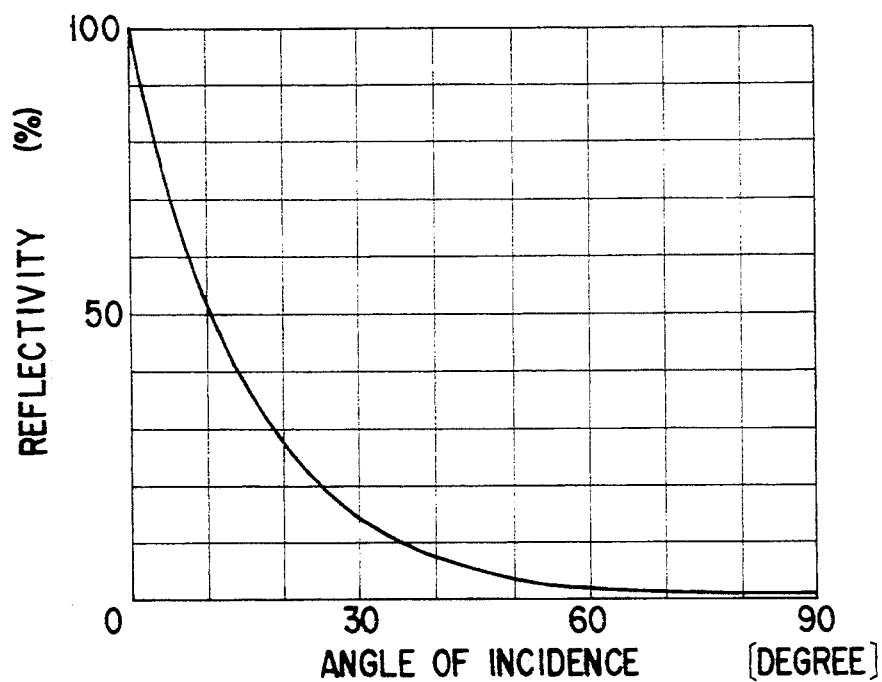
F I G. 9

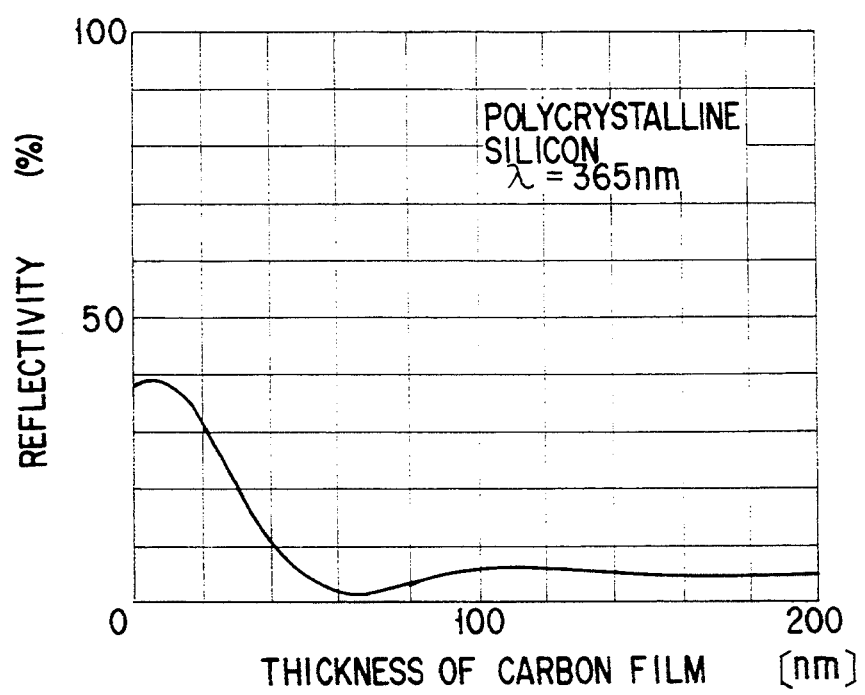
F I G. 10

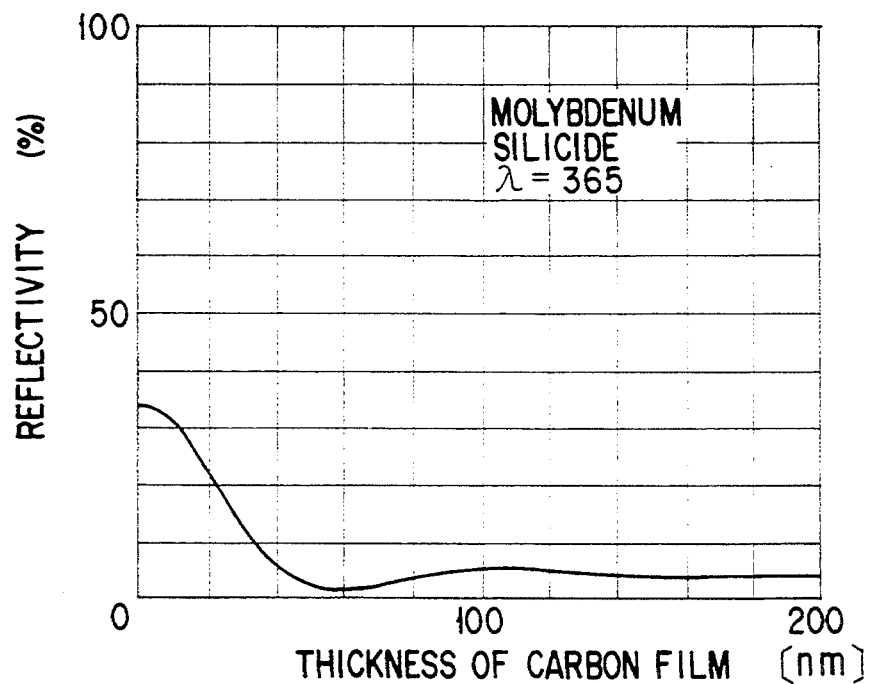
F I G. 11
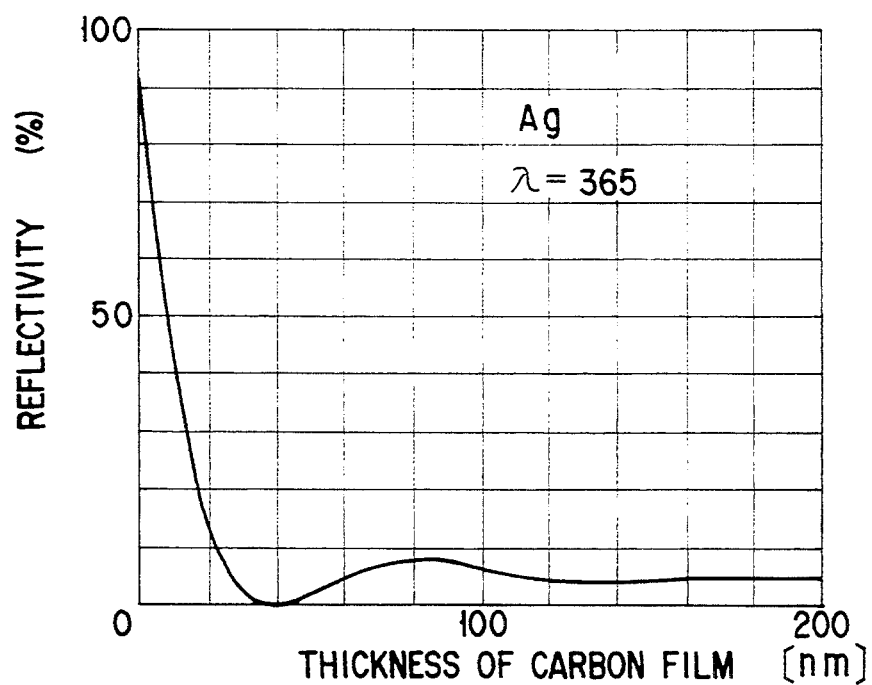
F I G 12

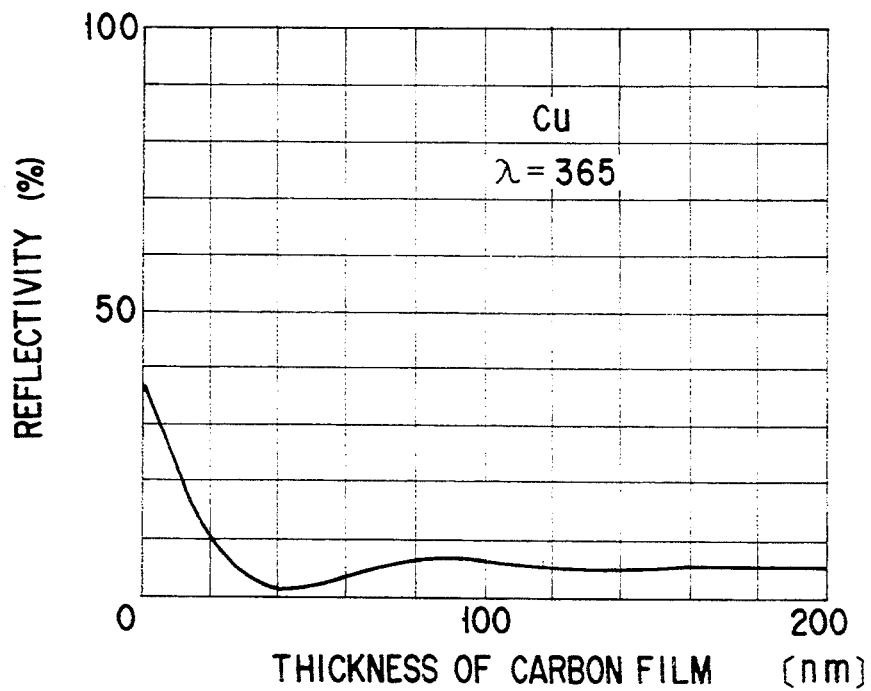
F I G. 13
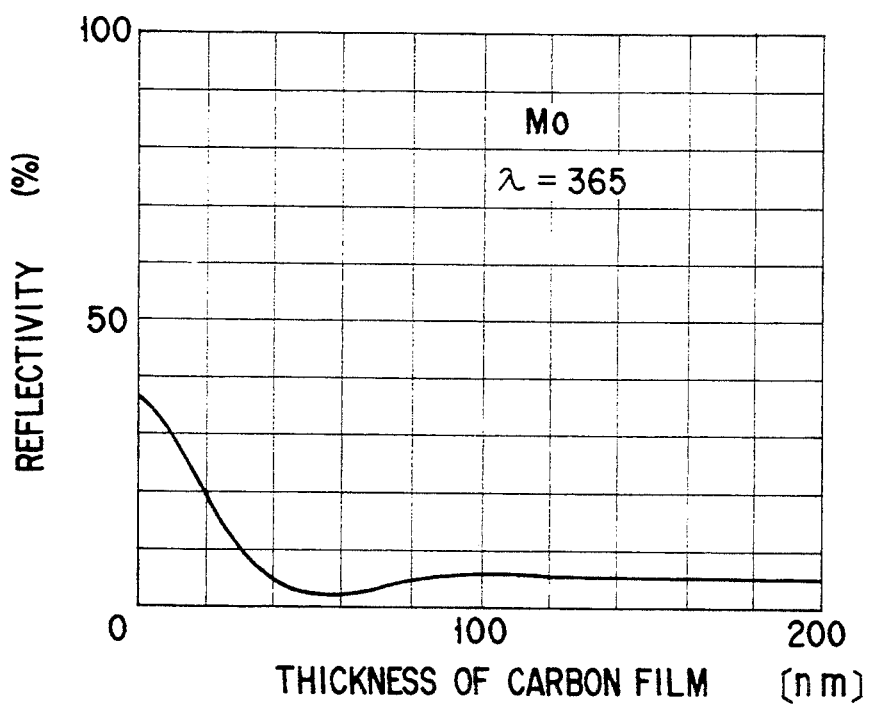
F I G. 14

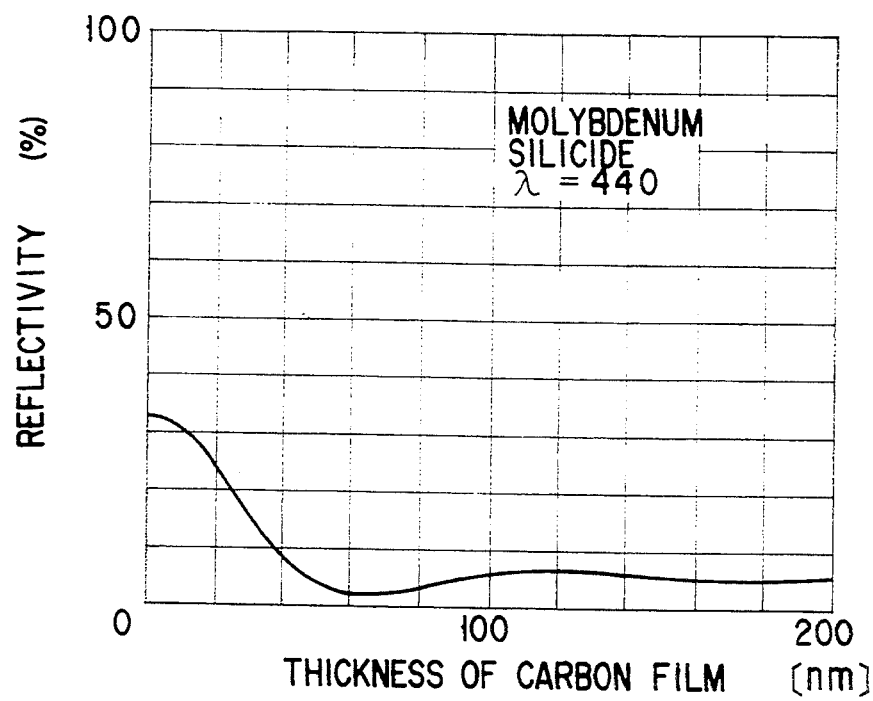
F I G. 17
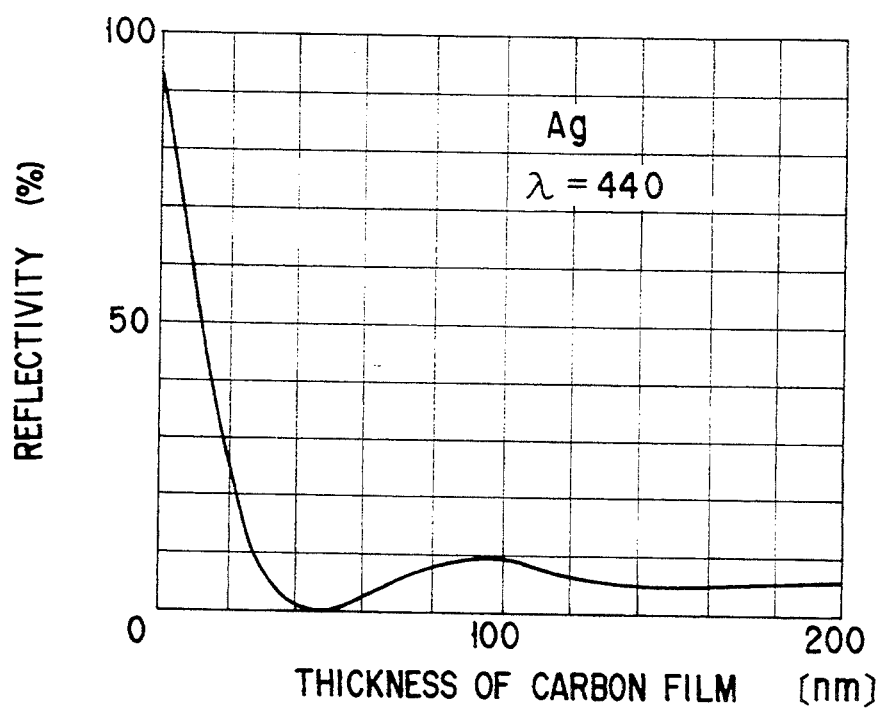
F I G. 18

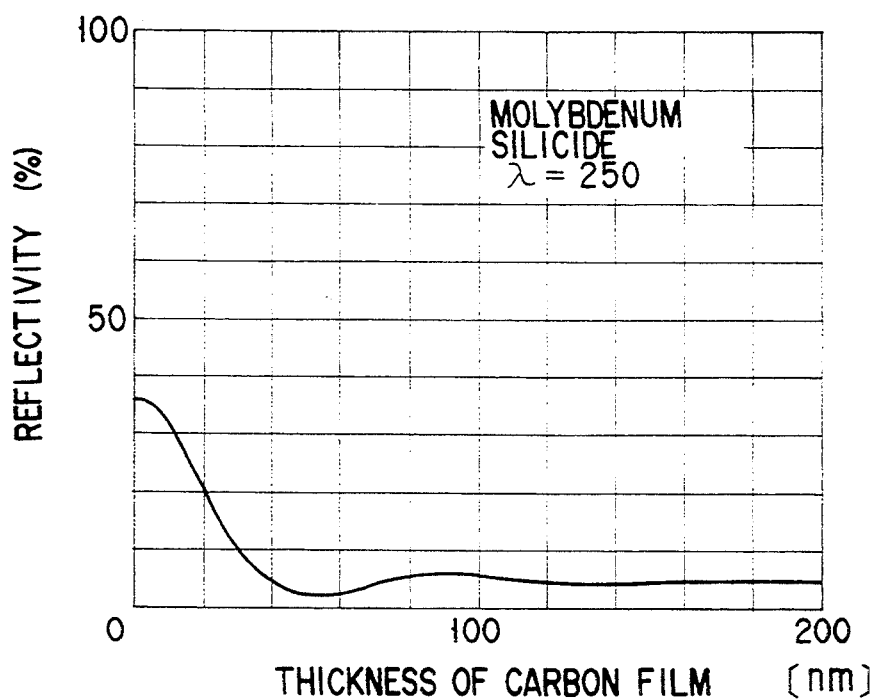
F I G. 23
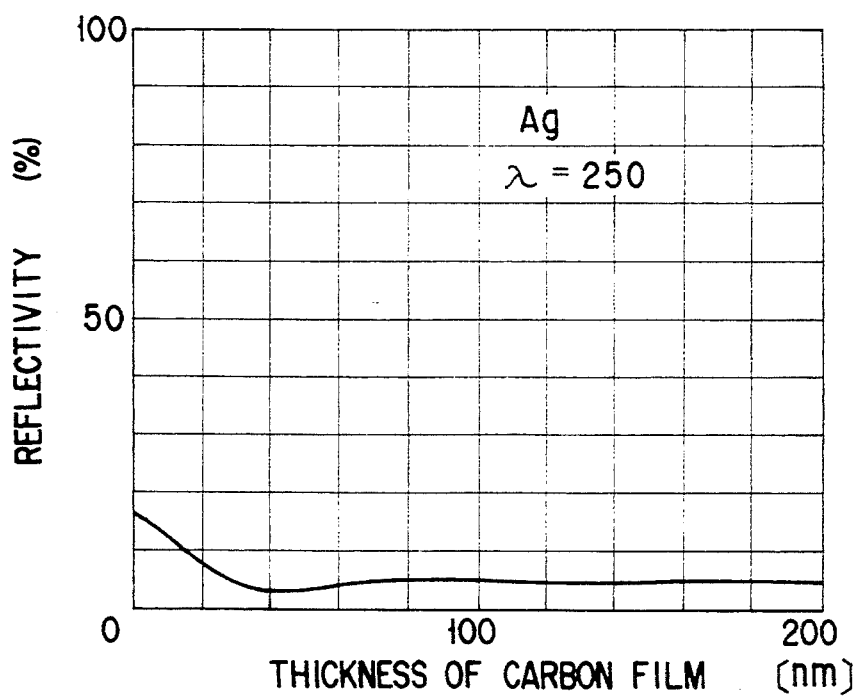
F I G. 24

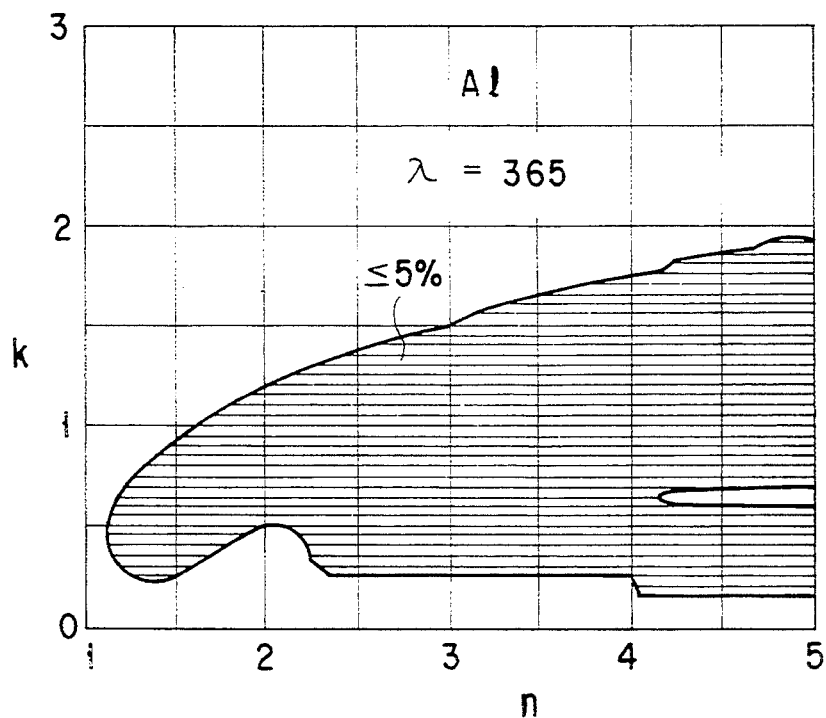
F I G. 27
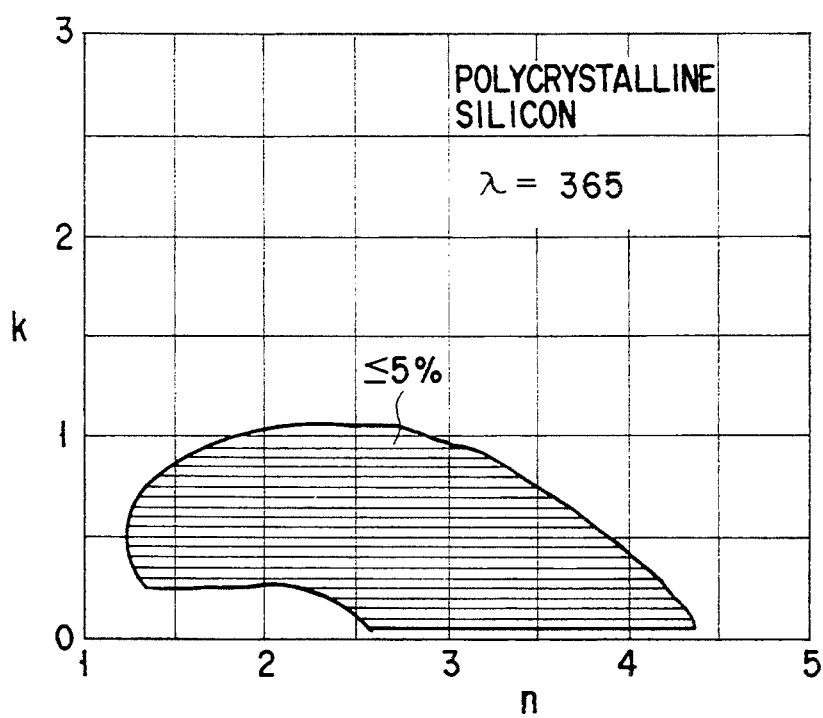
F I G. 28

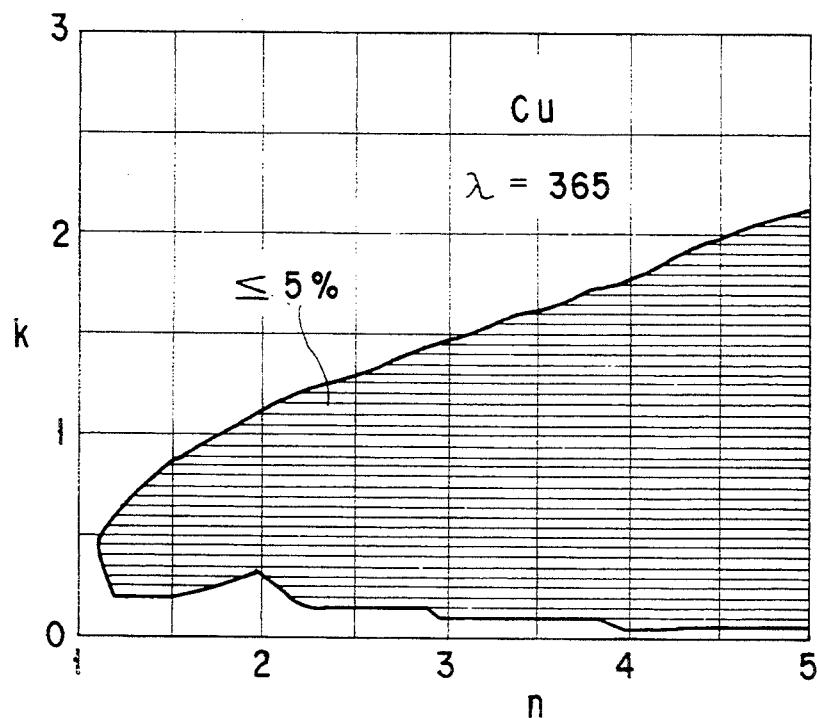
F I G. 31
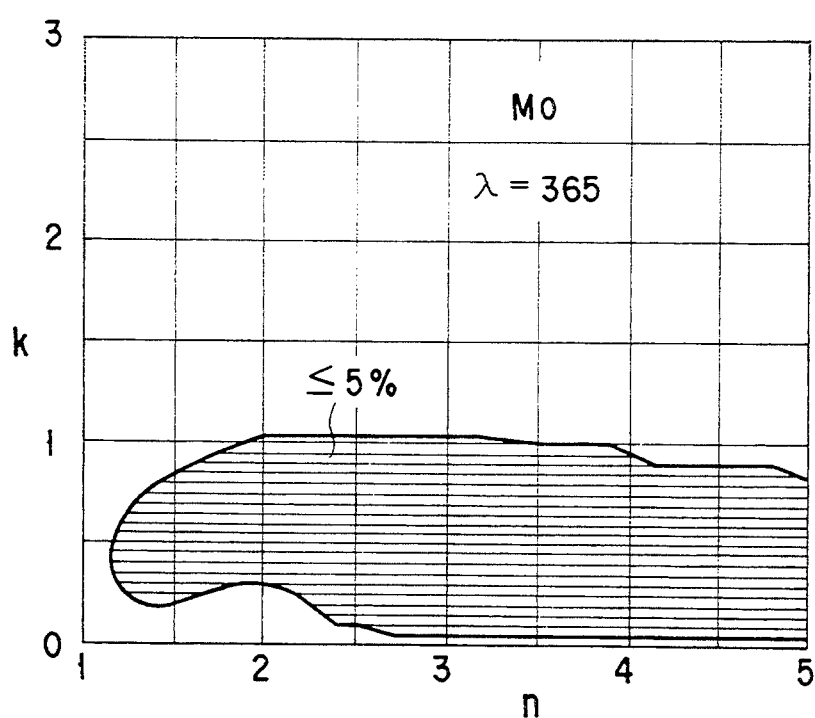
F I G. 32

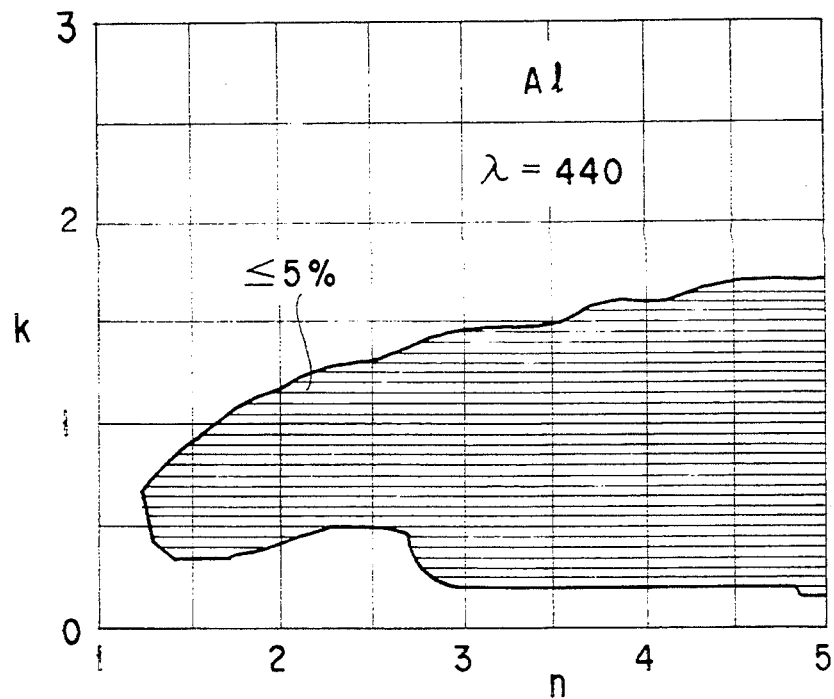
F I G. 33
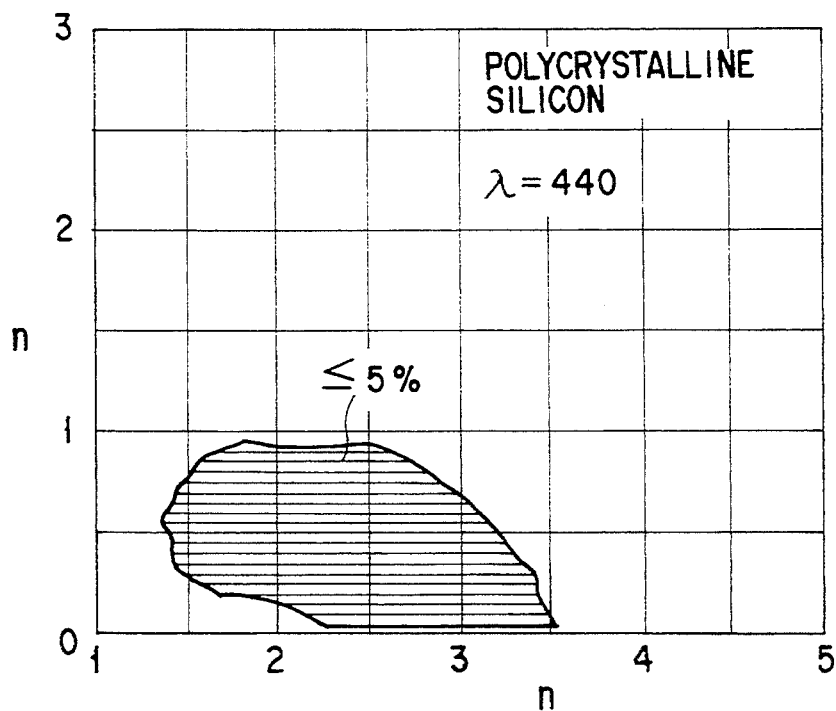
F I G. 34

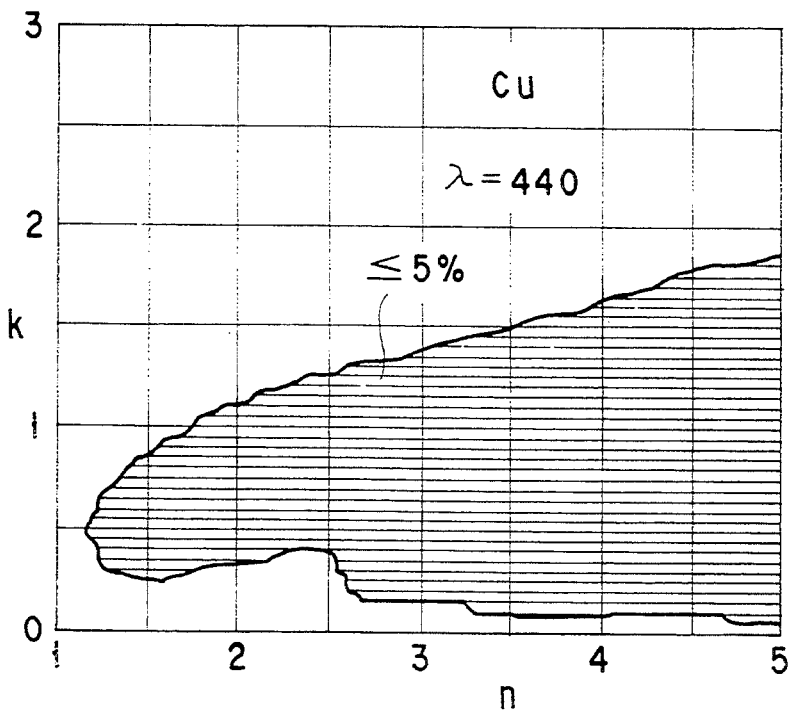
F I G. 37
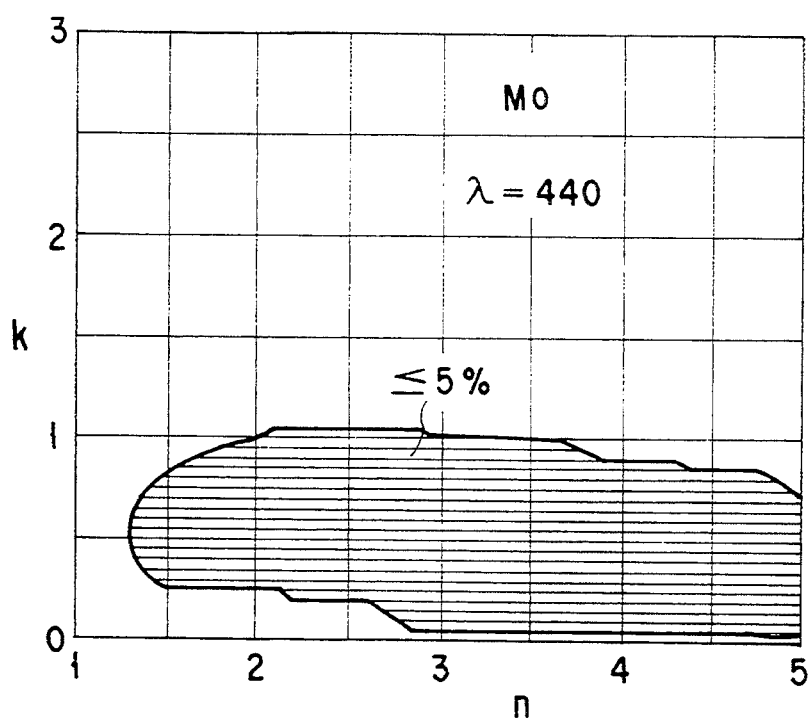
F I G. 38

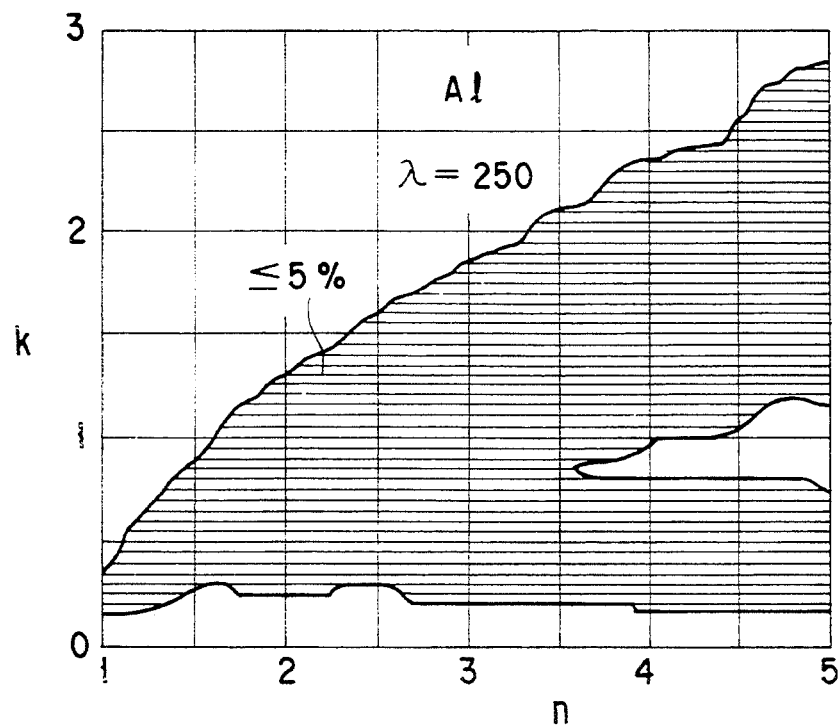
F I G. 39
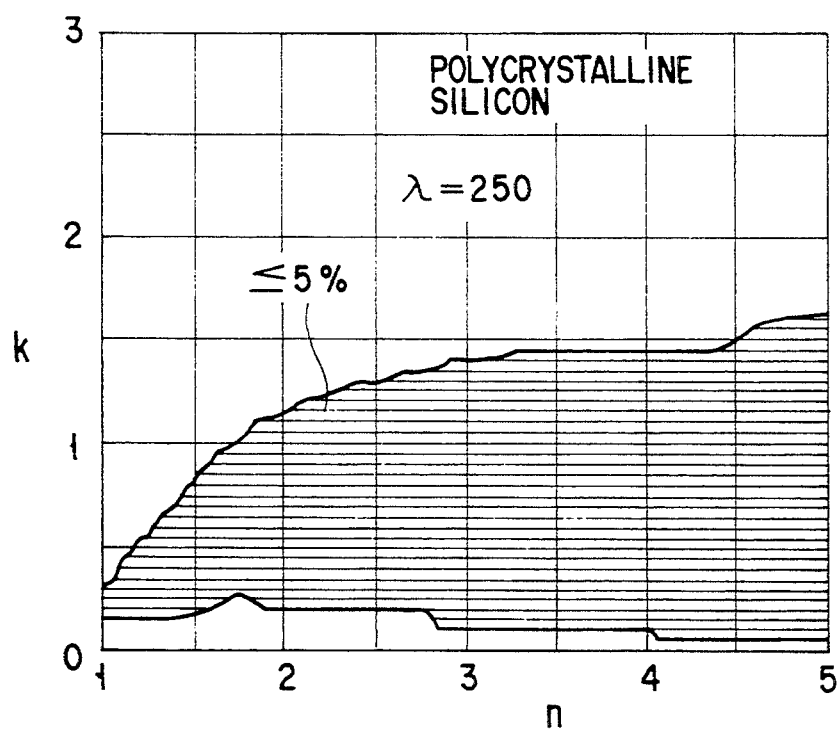
F I G. 40

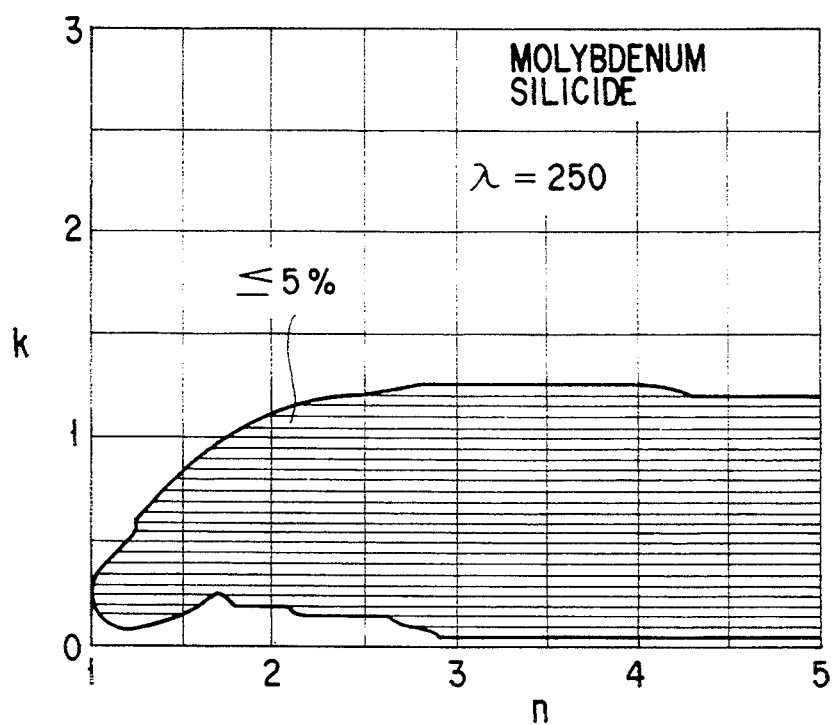
F I G. 41
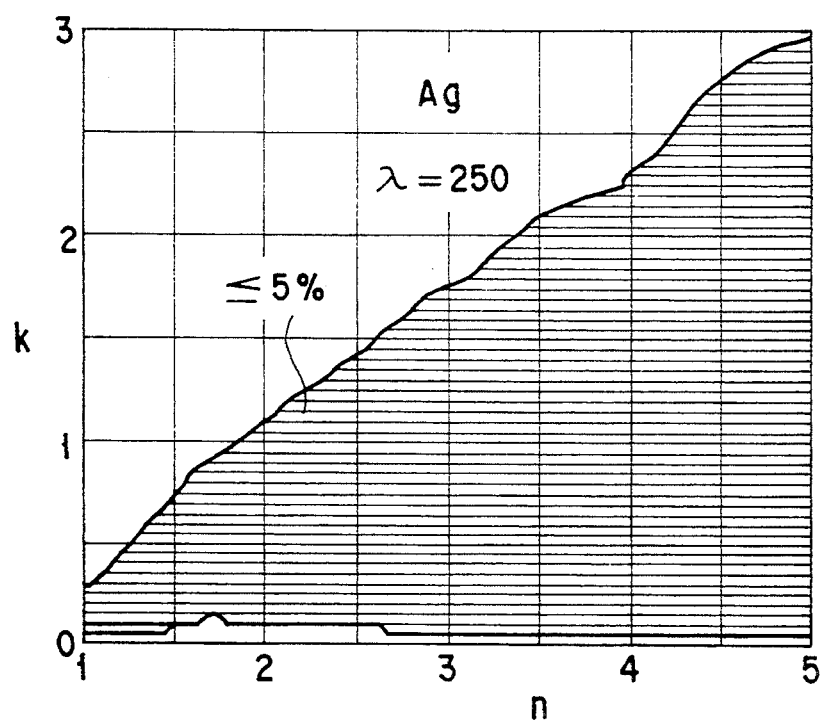
F I G. 42

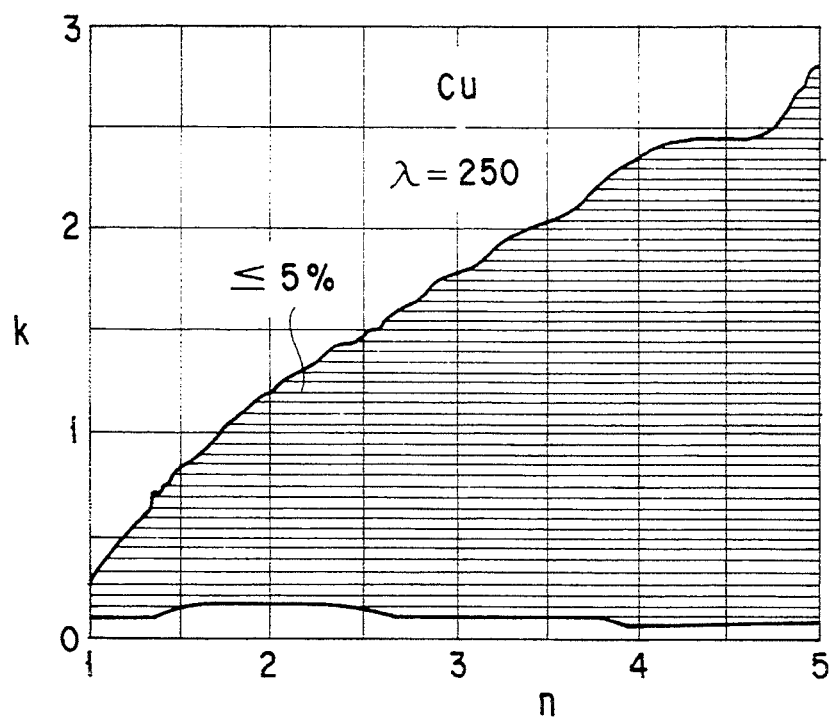
F I G. 43
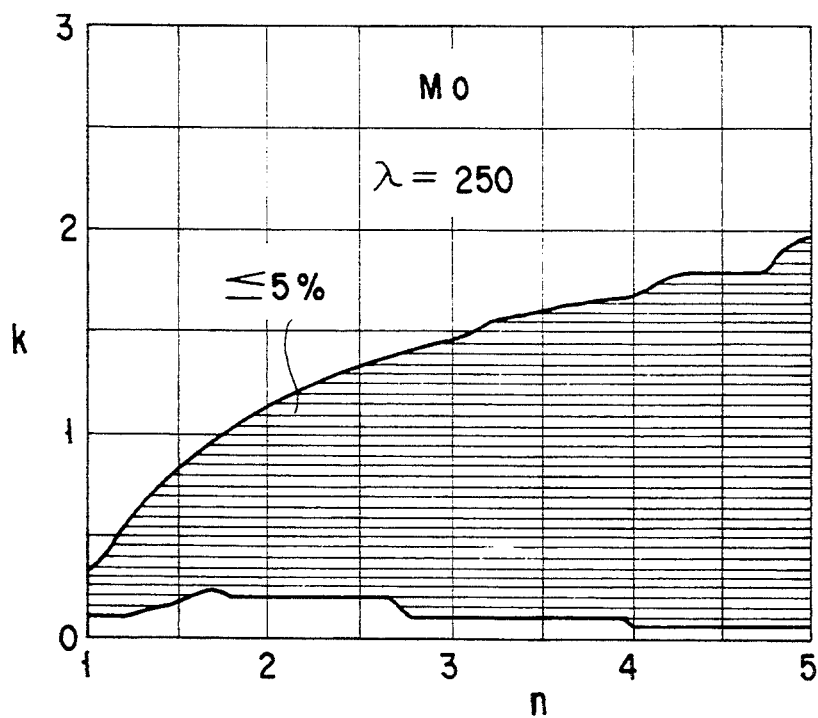
F I G. 44

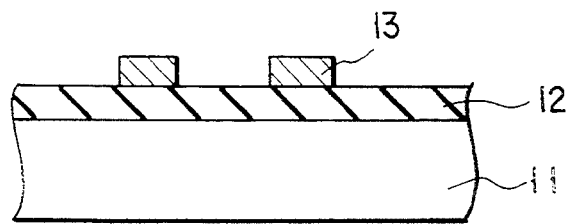
F I G. 45A
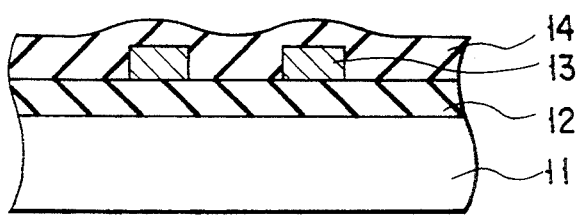
F I G. 45B
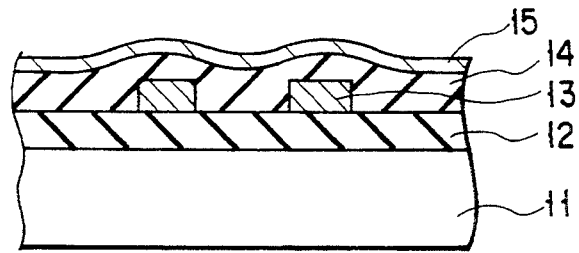
F I G. 45C
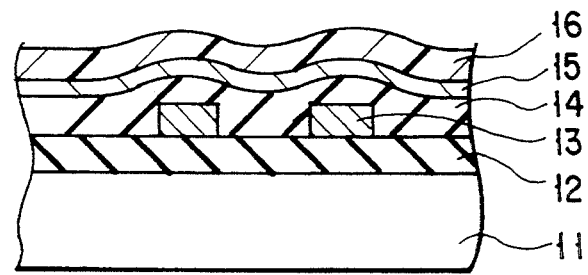
F I G. 45D F I G. 45E 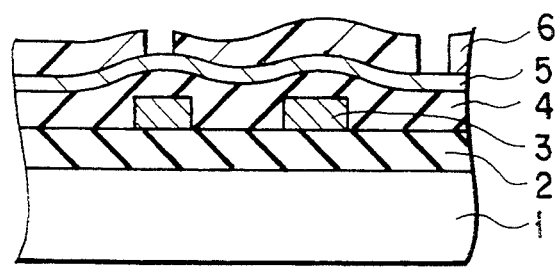
F I G. 45F 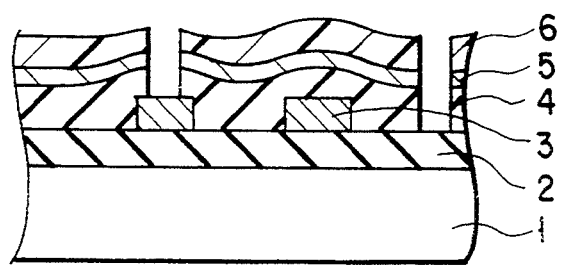
F I G. 45G 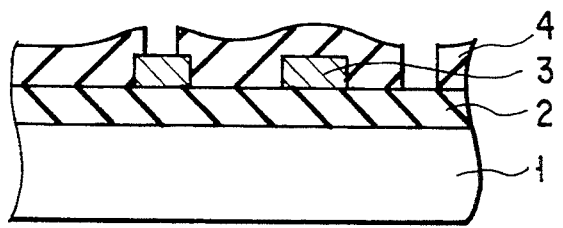

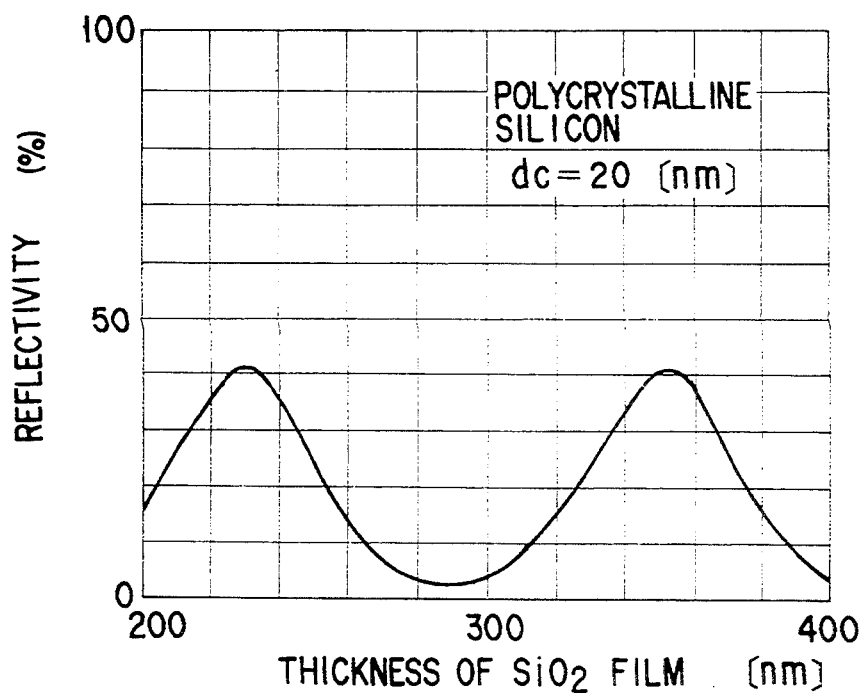
F I G. 50
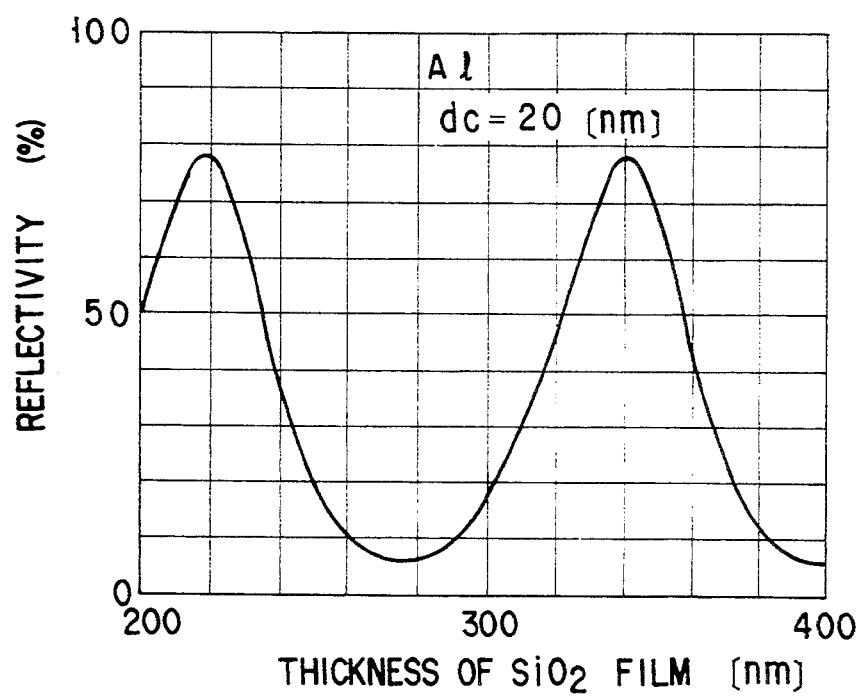
F I G. 51

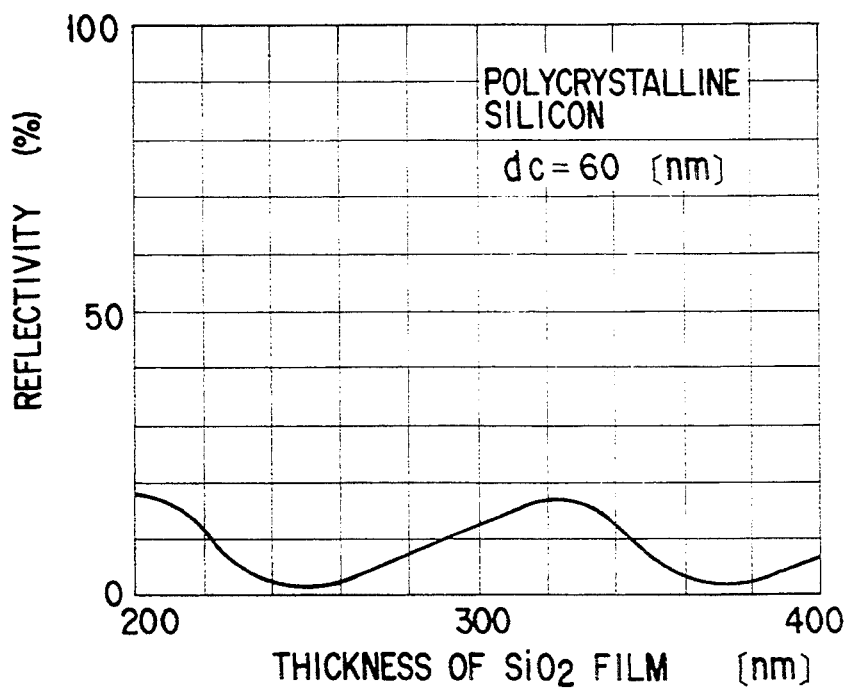
F I G. 54
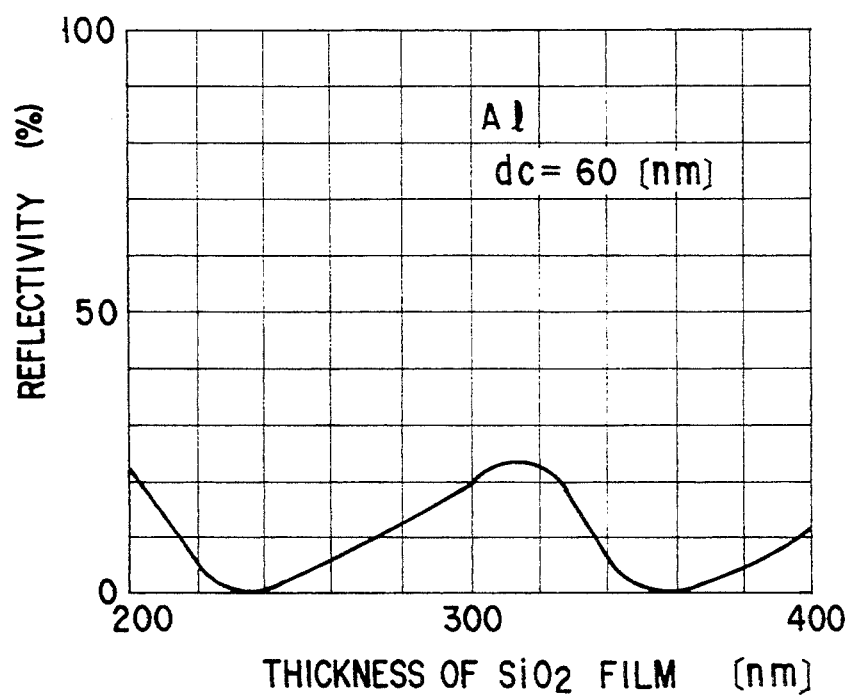
F I G. 55

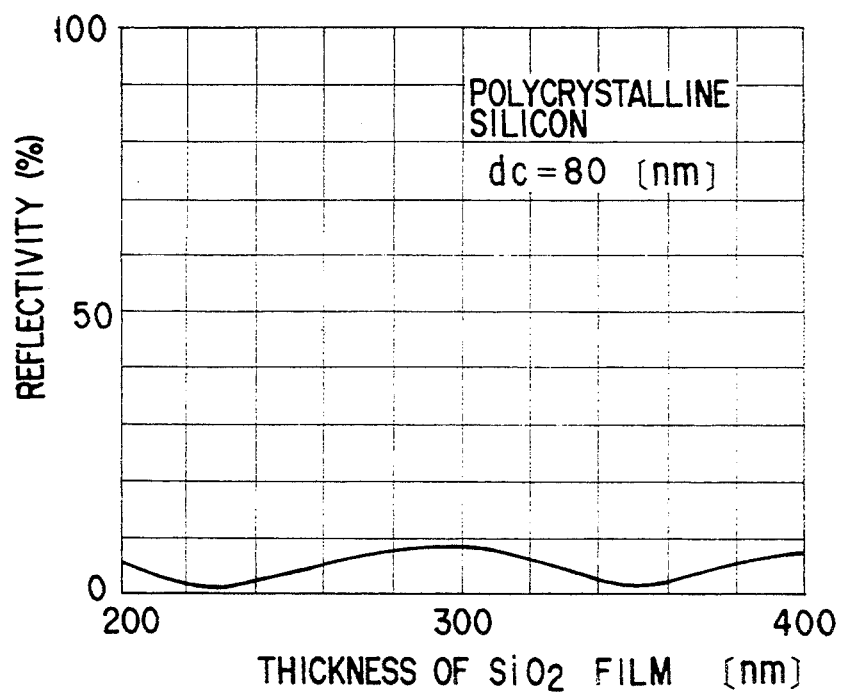
F I G. 56
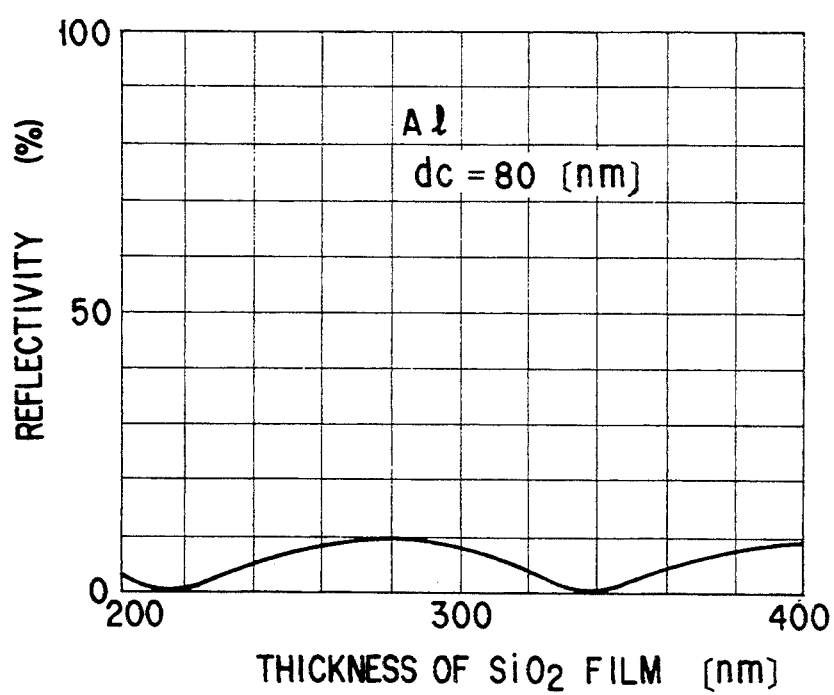
F I G. 57

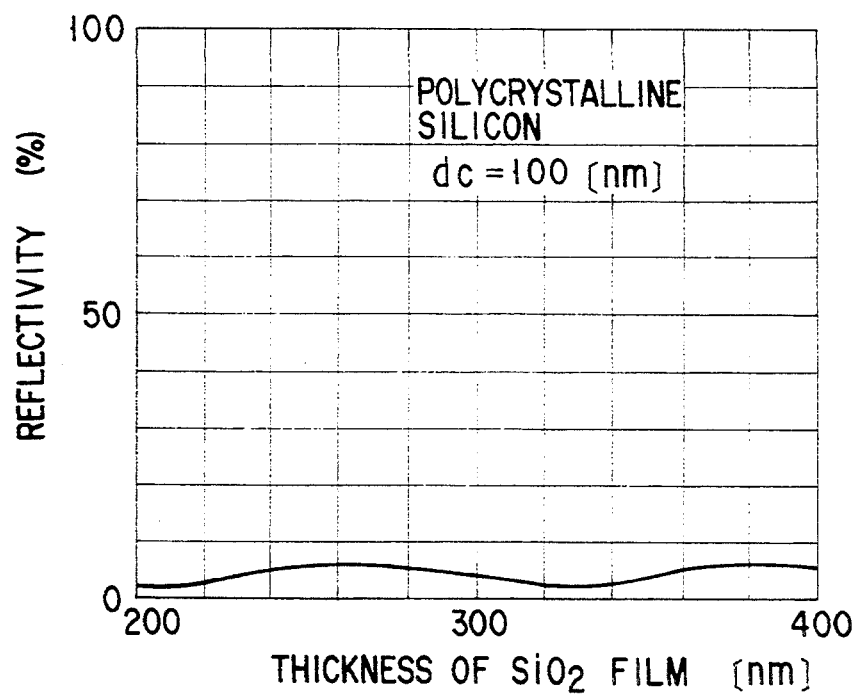
F I G. 58
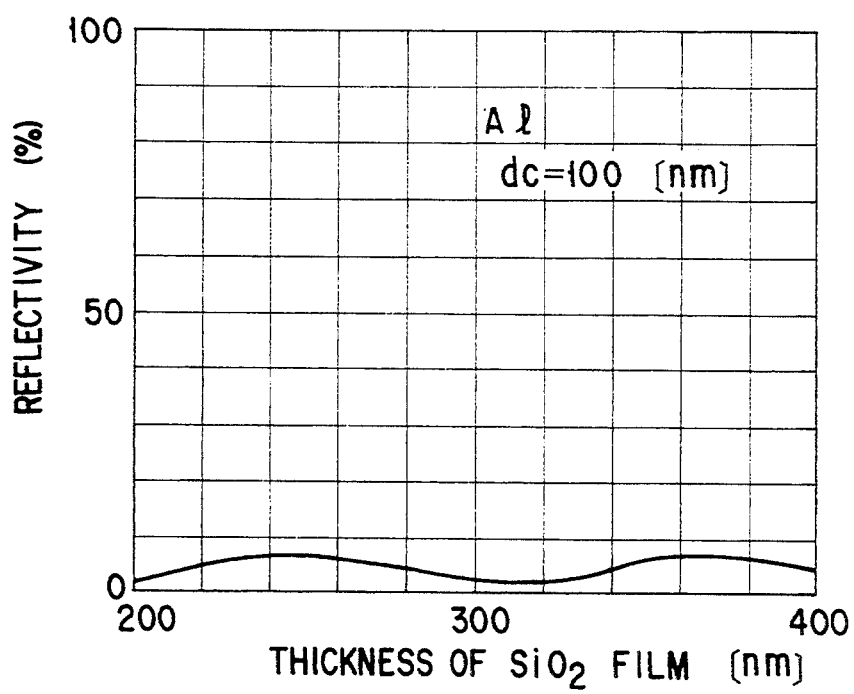
F I G. 59

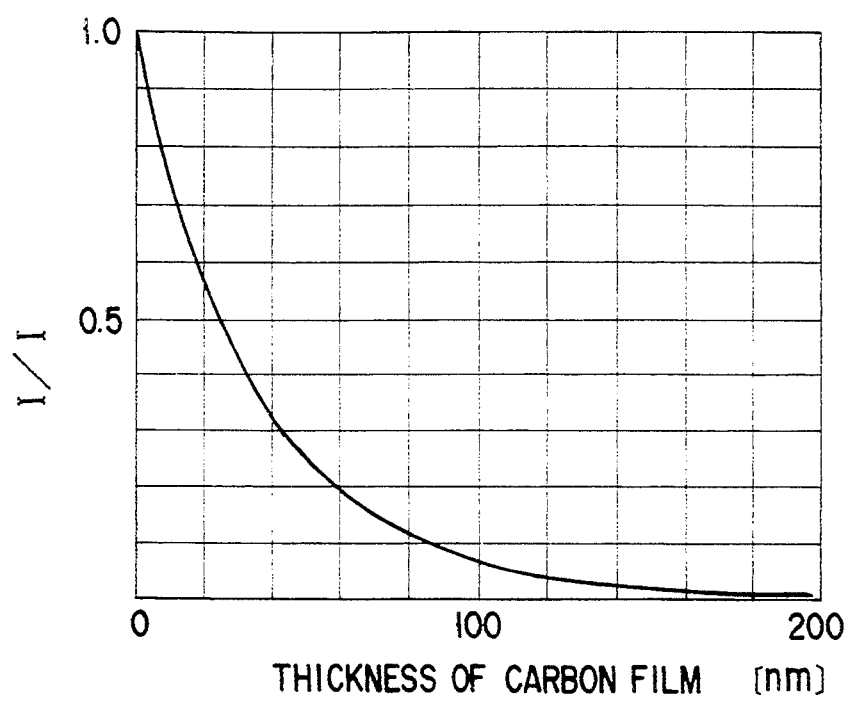
F I G. 60

METHOD OF MANUFACTURING SEMICONDUCTOR DEVICE

This application is a Continuation of application Ser. No. 07/799,440, filed on Nov. 27, 1991, now abandoned.

BACKGROUND OF THE INVENTION

1. Field of the Invention

The present relates to a method of manufacturing a semiconductor device and, more particularly, to an improvement in a technique of patterning a metal film, an insulating film, and the like.

2. Description of the Related Art

In a conventional process of manufacturing a semiconductor device, a metal film, e.g., a metal wiring layer is formed in the following manner. A conventional method of forming a metal wiring layer will be described below with reference to FIGS. 1A to 1G.

As shown in FIG. 1A, after an insulating film 52 is deposited on a semiconductor substrate 51, a lower wiring layer 53 is formed on the insulating film 52, and an inter-layer insulating layer 54 is deposited on the entire surface of the resultant structure.

A metal film 55 is formed on the inter-layer insulating layer 54, as shown in FIG. 1B. Thereafter, as shown in FIG. 1C, a photoresist (photosensitive resin layer) 56 is directly coated on the metal film 55.

Subsequently, as shown in FIG. 1D, the photoresist 56 is exposed with a desired pattern. The photoresist 56 is subjected to a development process to form a photoresist pattern 56.

As shown in FIG. 1F, the metal film 55 is selectively etched by the reactive ion etching (RIE) method using the photoresist pattern 56 as a mask.

Finally, as shown in FIG. 1G, the photoresist pattern 56 is removed to complete an upper wiring layer consisting of the metal film 55.

In a method of this type, however, the following problems are posed.

Light 57, which has passed through and reached the upper surface of the metal film 55 in the process of exposure, is reflected by the surface, and reflected light 58 enters the photoresist 56 again. As a result, abnormal exposure occurs in the photoresist 56. Especially, as shown in FIG. 1D, if the upper surface of the metal film 55 has large irregularities, the influence of the abnormal exposure is increased. As a result, as shown in FIG. 1E, the pattern transferred to the photoresist 56 is distorted as compared with the mask pattern. This distortion of the photoresist pattern 56 poses a serious problem when the metal film 55 is patterned by the RIE method using the photoresist pattern 56 as a mask.

That is, since part of the photoresist pattern 56 is omitted, as shown in FIG. 1E, the corresponding part of the patterned metal film 55 is also omitted, as shown in FIG. 1F. In the worst case of this phenomenon, the patterned metal film 55 is disconnected, resulting in a great deterioration in precision and reliability of patterning. In addition, the yield of products is decreased.

In order to solve the above problem, a method using a pigment-containing resist and a method of forming a titanium nitride film between a metal film and a photoresist have been proposed.

In the method using a pigment-containing resist, the distortion of a photoresist due to abnormal exposure cannot be satisfactorily suppressed, and hence the above problem cannot be solved. In addition, the focusing margin in the process of exposure is undesirably reduced.

In the method using a titanium nitride film, after a metal film is selectively etched, a titanium nitride film on the metal film is removed to prevent corrosion of the metal film and the like. However, since it is difficult to set a sufficiently high etching selectivity between a titanium nitride film and an insulating film, the insulating film is undesirably etched when the titanium nitride film is removed by etching. As a result, the reliability and yield of products are decreased.

In addition to the above-described methods, a method of forming a fine pattern by forming a carbon film between a film to be processed and a photoresist film has been proposed in Published Unexamined Japanese Patent Application No. 60-117723.

In the method, however, dimensional change occurs between a size of a carbon film and that of a photoresist because the carbon film has a thickness of as large as 180 nm or 110 nm. Assume that a carbon film having a thickness of e.g. 100 nm is to be patterned by etching, using a diode type plasma etching apparatus, under the following conditions: an oxygen flow rate of 100 SCCM, a pressure of 40 mTorr, and a power density of 2 W/cm$^2$. In this case, a side wall portion of the carbon film is tapered at an angle of about 63°. Therefore, if the carbon film has a thickness of 100 nm as described above, a size difference of 90 nm or more is caused between the bottom and top of the carbon film. In semiconductor integrated circuit, it is desired to decrease such a dimensional change.

Journal of Technical Disclosure No. 78-2427 (Japan Institute of Invention and Innoration) discloses an exposure is performed by intervening a carbon film between a wafer and a photoresist film, thus preventing the reflectance by the wafer. However, both the thinner carbon film and lower reflectivity are not realized yet.

In a conventional method, an insulating film such as an inter-layer insulating layer is patterned in the following manner. FIGS. 2A to 2G are sectional views showing the respective steps in the method.

As shown in FIG. 2A, an insulating film 62 is deposited on a semiconductor substrate 61, and a lower wiring layer 63 is formed on the insulating film 62.

As shown in FIG. 2B, an insulating film 64 as an inter-layer insulating layer is deposited on the entire surface of the resultant structure. Thereafter, a photoresist (photosensitive resin layer) 65 is directly coated on the insulating film 64, as shown in FIG. 2C.

Subsequently, as shown in FIG. 2D, the photoresist 65 is exposed with a desired pattern. Thereafter, as shown in FIG. 2E, the photoresist 65 is subjected to a development process to form a photoresist pattern 65.

As shown in FIG. 2F, the insulating film 64 is selectively etched by the reactive ion etching (RIE) method using the photoresist pattern 65 as a mask.

Finally, as shown in FIG. 2G, the photoresist 65 is removed to complete patterning of the inter-layer insulating layer 64.

In this method, the following problems are posed.

As shown in FIG. 2D, part of incident light 66, which has passed through the photoresist 65 in the process of exposure, further passes through the insulating film 64 to reach the upper surface of the lower wiring layer 63, and is reflected by the surface. Reflected light 67 enters the photoresist 65 again. Another incident light 66a passes through the insulating films 64 and 62 to reach the semiconductor substrate 61 and is reflected by its surface. Reflected light 68 then enters the photoresist 65 again. The photoresist 65 is exposed again with the reflected light 67 and the reflected light 68. In this case, since the optical characteristics of the lower wiring layer 63 are different from those of the semiconductor substrate 61, the intensity of the reflected light 67 is different from that of the reflected light 68. In addition, since the distance that the reflected light passes through the insulating film is different from the distance that the reflected light 68 passes through the insulating films, a phase difference occurs between the beams of reflected light when they reach the photoresist 65, and a difference in intensity occurs when they interfere with the incident light 66.

As a result, the photoresist 65 is very differently exposed depending on positions, and hence the mask pattern cannot be faithfully transferred to the photoresist 65.

FIGS. 3A to 3G are sectional views showing the respective steps of another conventional method of patterning an insulating film.

As shown in FIG. 3A, the upper surface of a semiconductor substrate 71 is selectively oxidized to form insulating oxide films 72. An insulating film 73 and a polycrystalline silicon film 74 are then formed on the entire upper surface of the substrate 71 on which the insulating oxide films 72 are formed.

After an insulating film 75 is deposited on the polycrystalline silicon film 74, as shown in FIG. 3B, a photoresist 76 is directly coated on the insulating film 75, as shown in FIG. 3C.

After the photoresist 76 is exposed with a desired pattern, as shown in FIG. 3D, the photoresist 76 is subjected to a development process to form a photoresist pattern 76.

Subsequently, as shown in FIG. 3F, the insulating film 75 is selectively etched by reactive ion etching (RIE) using the photoresist pattern 76 as a mask. Finally, as shown in FIG. 3G, the photoresist pattern 76 is removed to compete patterning of the insulating film 75.

In this method, however, the following problems are also posed.

As shown in FIG. 3D, incident light, which has passed through the photoresist 76 in the process of exposure, further passes through the insulating film 75 to reach the upper surface of the polycrystalline silicon film 74, and is reflected by the surface. Reflected light 78 then enters the photoresist 76 again. As a result, portions of the photoresist 76, other than the portion corresponding to the mask pattern are exposed, thus causing abnormal exposure. Especially, as shown in FIG. 3D, if the upper surface of the polycrystalline silicon film 74 has large irregularities, the influence of the abnormal exposure is increased. As a result, the pattern transferred to the photoresist 76 is distorted as compared with the mask pattern.

If the thickness of the insulating film 75 varies at different positions, the phase of the reflected light 78, which has reached the photoresist 76, varies depending on the incident positions. Therefore, when the reflected light 78 interferes with the incident light 77, variations in intensity of light are caused, and the photoresist 76 varies in size at the respective positions.

The size differences due to the distortion of the photoresist 76 and those at the respective positions affect the polycrystalline silicon film 75. For this reason, the pattern formed on the insulating film 75 also suffers from size differences due to distortion and those at different positions. Such inconvenience leads to not only a deterioration in precision and reliability of patterning of an insulating film but also a decrease in yield of products.

In order to solve such problems, a method of patterning an insulating film by using a pigment-containing resist is proposed. In the method of using a pigment-containing resist, however, the distortion of a photoresist pattern due to abnormal exposure cannot be satisfactorily suppressed, and hence the above-described problems cannot be solved. In addition, the focusing margin in the process of exposure is undesirably reduced.

As described above, in the conventional process of patterning a metal film, when a photoresist is exposed, exposure light is reflected by the upper surface of a metal film, resulting in distorting the pattern transferred to the photoresist.

In the process of patterning an insulating film, since exposure light is reflected by the upper surface of a semiconductor substrate or that of a metal wiring layer, the pattern transferred to the photoresist is distorted. Since a film to be processed, such as a metal film or an insulating film, is patterned by using the distorted photoresist pattern as a mask, the precision and reliability of patterning are degraded, and the yield of products is decreased.

SUMMARY OF THE INVENTION

It is an object of the present invention to provide a method of manufacturing a semiconductor device, which can improve precision and reliability in patterning of a metal film or an insulating film.

According to the present invention, there is provided a method of manufacturing a semiconductor device, comprising the steps of:
 forming a carbon layer on a light-reflective layer;
 forming a photosensitive resin layer on the carbon layer;
 selectively radiating light on the photosensitive resin layer;
 forming a photosensitive resin pattern by developing the photosensitive resin layer selectively irradiated with the light;
 forming a carbon pattern by etching the carbon layer using the photosensitive pattern as a mask; and
 forming a light-reflective pattern by etching the light-reflective layer using the photosensitive resin layer or the carbon pattern as a mask, a thickness of the carbon layer being set to such a value as a total reflectivity of light reflected by the light-reflective layer and light reflected by the carbon film is lower than an intrinsic reflectivity of the carbon film.

In addition, according to the present invention, there is provided a method of manufacturing a semiconductor device, comprising the steps of:
 forming a carbon layer on a light-reflective layer;
 forming a photosensitive resin layer on the carbon layer;
 selectively radiating light on the photosensitive resin layer;
 forming a photosensitive resin pattern by developing the photosensitive resin layer selectively irradiated with the light;
 forming a carbon pattern by etching the carbon layer using the photosensitive pattern as a mask; and
 forming a light-reflective pattern by etching the light-reflective layer using the photosensitive resin layer or the carbon pattern as a mask, the carbon layer having a thickness which satisfies the following relation (1).

$$0.05 \geq \left| \frac{r_R + r_B \exp(-4\pi N_B d_B i/\lambda)}{1 + r_B r_R \exp(-4\pi N_B d_B i/\lambda)} \right|^2 \quad (1)$$

where $d_B$ is a thickness of a carbon film, $\lambda$ is a wavelength of exposure light, $N_A$ is an optical constant of Al film, $N_B$ is an optical constant of a carbon film, $N_R$ is an optical constant of a photosensitive resin layer, $r_R = (N_R - N_B)/(N_R + N_B)$, and $r_B = (N_B - N_A)/(N_B + N_A)$.

Furthermore, according to the present invention, there is provided a method of manufacturing a semiconductor device, comprising the steps of:

forming a transparent layer on a light-reflective layer;
forming a carbon layer on the transparent layer;
forming a photosensitive resin layer on the carbon layer;
selectively radiating light on the photosensitive resin layer;
forming a photosensitive resin pattern by developing the photosensitive resin layer selectively irradiated with the light;
forming a carbon pattern by etching the carbon layer by using the photosensitive resin pattern as a mask; and
forming a transparent layer pattern by etching the transparent layer using the photosensitive resin pattern or the carbon pattern as a mask, so that a thickness d of the carbon layer, an extinction coefficient k of the carbon layer, and a wavelength $\lambda$ of exposure light satisfy $0.17 \leq kd/\lambda$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A and 5B are plan views showing wiring patterns respectively formed by a method of the first embodiment and a conventional method;

FIGS. 6 to 8 are graphs respectively showing the relationships between the thicknesses of a titanium nitride film, a silicon film, and a carbon film and the reflectivity of exposure light;

FIG. 9 is a graph showing the relationship between the incidence angle of exposure light and its reflectivity;

FIGS. 10 to 26 are graphs respectively showing the relationships between the thickness of a carbon film and the reflectivity of beams of exposure light having various wavelengths in cases wherein a polycrystalline silicon film, a molybdenum silicide film, an Ag film, a Cu film, an Mo film, and an Al film are used as films to be processed;

FIGS. 27 to 44 are graphs respectively showing the ranges, defined by the refractive indexes of carbon films and extinction coefficients, in which a reflectivity of 5% or less is obtained at various wavelengths of beams of exposure light, in cases wherein an Al film, a polycrystalline silicon film, a molybdenum silicide film, an Ag film, a Cu film, and an Mo film are used as films to be processed;

FIGS. 45A to 45G are sectional views showing the process of forming contact holes according to the second embodiment of the present invention;

FIGS. 48 to 59 are graphs showing the relationships between the thickness of an $SiO_2$ film and its reflectivity with various thicknesses of carbon films;

FIG. 60 is a graph showing the relationship between the absorbance of a carbon film and its thickness.

DETAILED DESCRIPTION OF THE PREFERRED EMBODIMENTS

Figure 1A:
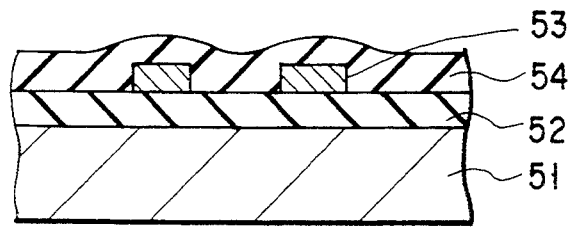
FIGS. 1A to 1G are sectional views showing a conventional process of forming a metal wiring layer.
Figure 1B:
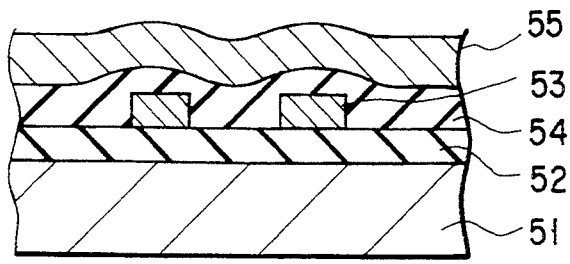
Figure 1C:
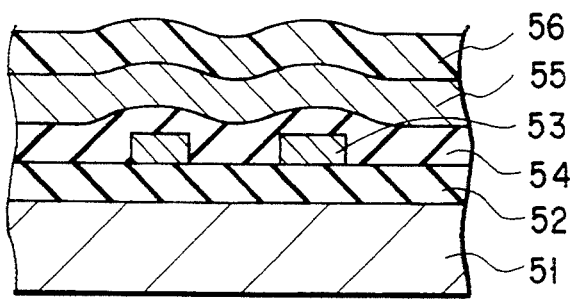
Figure 1D:
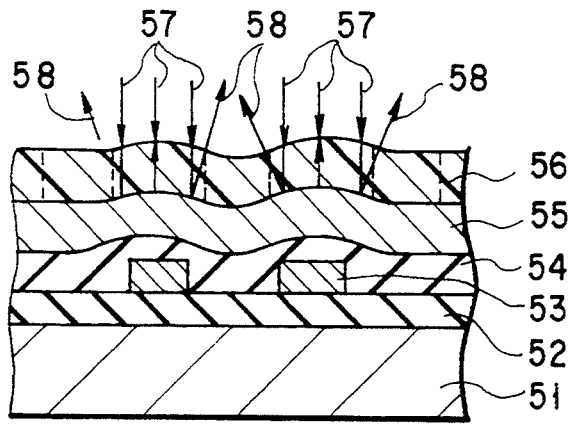
Figure 1E:
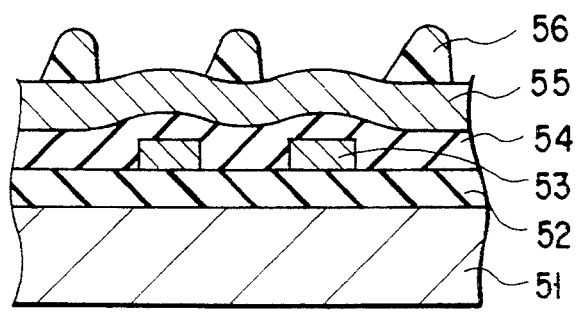
Figure 1F:
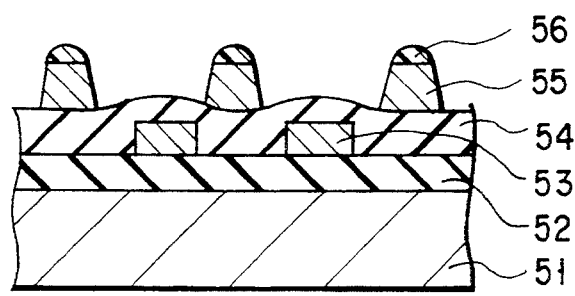
Figure 1G:
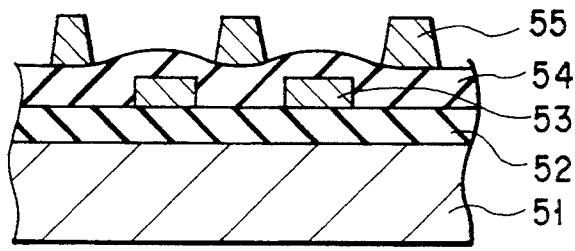
Figure 2A:
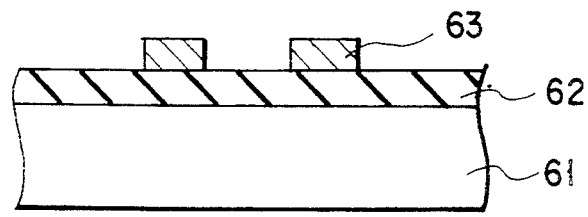
FIGS. 2A to 2G are sectional views showing a conventional process of forming an insulating film.
Figure 2B:
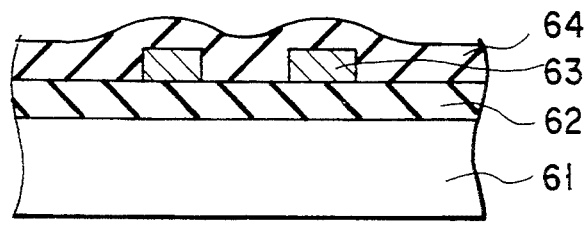
Figure 2C:
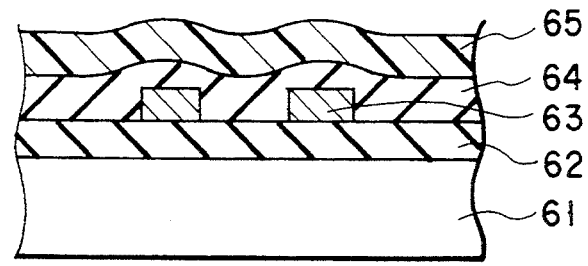
Figure 2D:
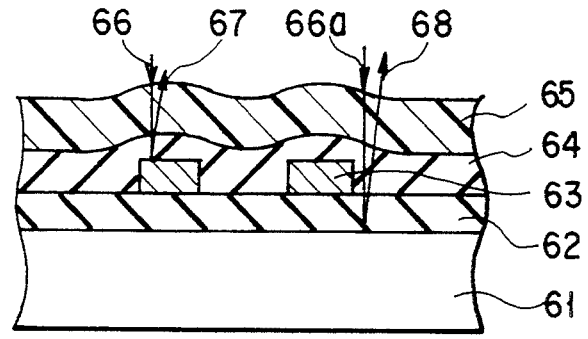
Figure 2E:
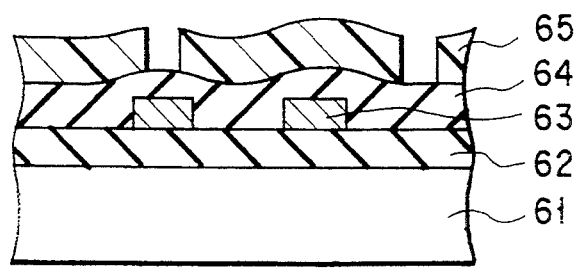
Figure 2F:
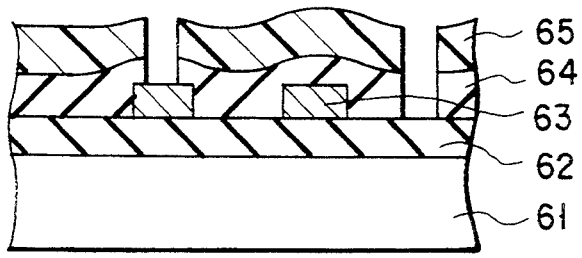
Figure 2G:
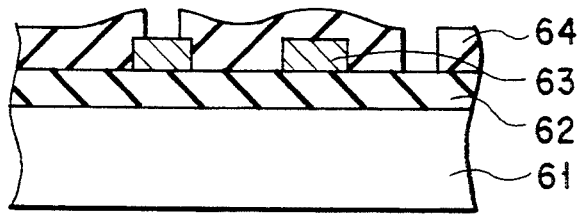
Figure 3A:
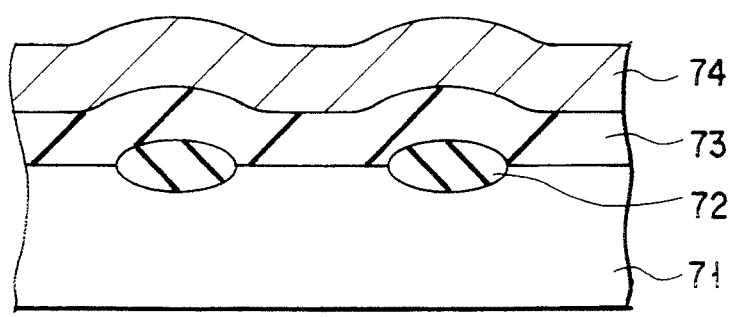
FIGS. 3A to 3G are sectional views showing another conventional process of forming an insulating film.
Figure 3B:
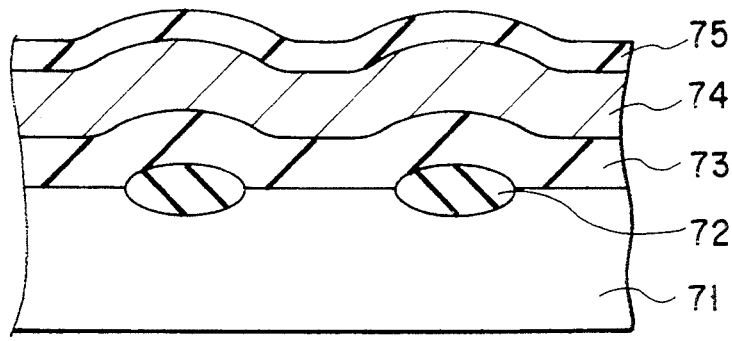
Figure 3C:
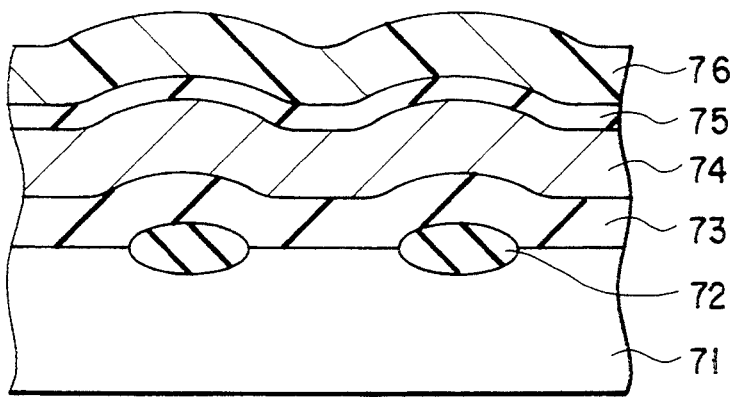
Figure 3D:
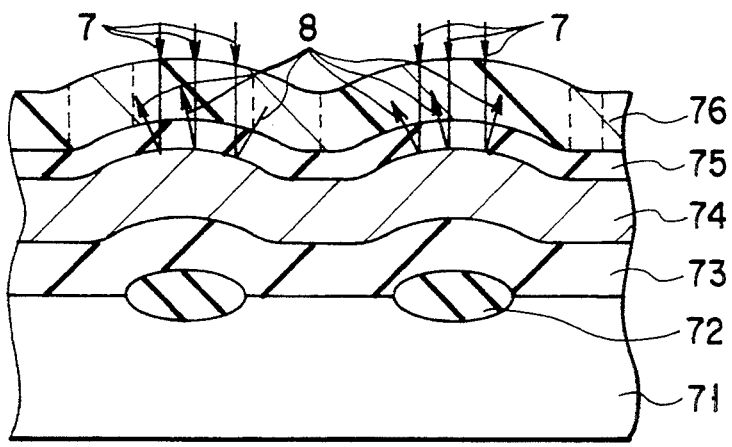
Figure 3E:
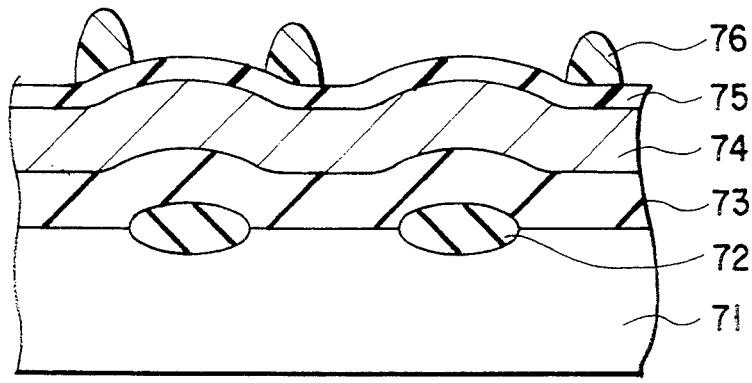
Figure 3F:
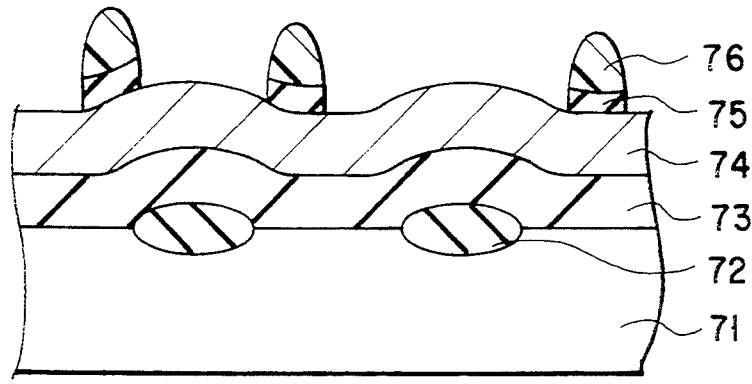
Figure 3G:
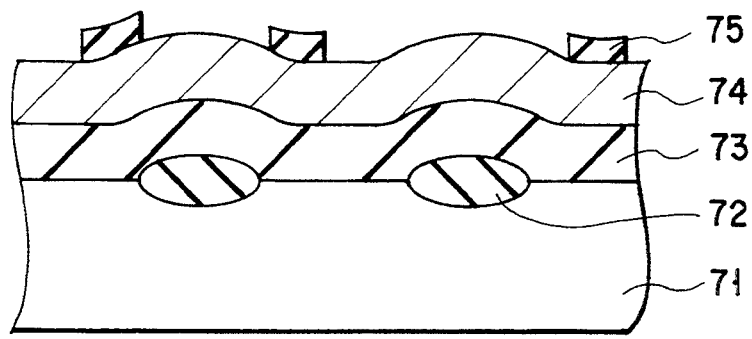

The present invention is characterized in that when a light-reflective layer, e.g., a metal layer, or a transparent layer, e.g., an insulating film, formed on a light-reflective layer is to be etched by using a photosensitive resin pattern as a mask, a photosensitive resin layer is exposed while a carbon film having a predetermined thickness is interposed between the light-reflective film or the transparent film and the photosensitive resin layer.

With this process, exposure of undesired portions of the photosensitive resin layer, which is caused when light reflected by the light-reflective film is incident on the photosensitive resin layer, can be prevented.

The present invention has two aspects. According to one aspect, a light-reflective film is patterned to form a wiring layer or the like. According to the other aspect, a transparent film formed on a light-reflective film is patterned to form an inter-layer insulating layer or the like.

In the former aspect, according to the studies of the present inventors, it was found that if the thickness of a carbon film was set to be less than 100 nm, preferably not less than 30 nm and most preferably 38-78 nm, exposure light reflected by the interface between a photosensitive resin layer and the carbon film canceled out exposure light reflected by the interface between the carbon film and a light-reflective film, and the minimum refractive index was obtained. In addition, according to the studies of the present inventors, it was found that the range of thickness of a carbon film, in which the reflectivity was sufficiently reduced, was less than 100 nm. Furthermore, it was found that the intensity of exposure light which had passed through a photosensitive resin layer was sufficiently reduced in a carbon film.

If, therefore, a carbon film is formed between a film to be processed and a photosensitive resin layer, and the photosensitive resin layer is exposed and developed, an accurate resist pattern can be easily formed, thus improving the precision and reliability in patterning.

As a light-reflective film as a film to be processed, a metal film, an alloy film, a silicide film, a semiconductor film, or the like can be used. More specifically, a polycrystalline silicon film, a molybdenum silicide film, an Ag film, a Cu film, or an Mo film, or a metallic compound film, e.g., an Al—Si—Cu film, an Al—Si film, an $MoSi_x$ film, or a $WSi_x$ film can be used.

In the latter aspect, according to the studies of the present inventors, it was found that the intensity of exposure light which had passed through a photosensitive resin layer was sufficiently reduced in a carbon film having a thickness of 80 nm or more, more preferably 80-200 nm. As a result, the intensity of light reflected by a light-reflective film under a transparent film to be processed was sufficiently reduced, thus preventing abnormal exposure of the photosensitive resin layer by the reflected light. In addition, since the intensity of the reflected light was sufficiently low, substantially no interference occurs between the reflected light and the exposure light incident on the photosensitive resin layer. Therefore, when exposure and development of a photosensitive resin layer are performed while a carbon film is formed between a transparent film to be processed and the photosensitive resin layer, an accurate resist pattern can be easily formed, thus improving the precision and reliability in patterning.

As a transparent film serving as a film to be processed, an $SiO_2$ film, a silicon nitride film, a resin film, or the like can be used.

Embodiments of the present invention will be described below with reference to the accompanying drawings.

FIGS. 4A to 4H are sectional views showing the process of forming a metal wiring (interconnection) layer according to the first embodiment of the present invention.

Figure 4A:
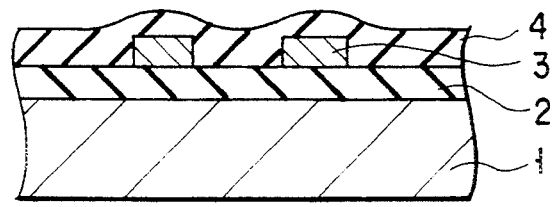
FIGS. 4A to 4H are sectional views showing the process of forming a metal wiring layer according to the first embodiment of the present invention.

As shown in FIG. 4A, a 1-$\mu$m thick $SiO_2$ film 2 was formed on an Si substrate 1 in which elements (not shown) were formed. After an 800-nm thick Al wiring layer 3 was formed on the $SiO_2$ film 2, an $SiO_2$ film 4 was formed on the entire upper surface of the $SiO_2$ film 4.

Figure 4B:
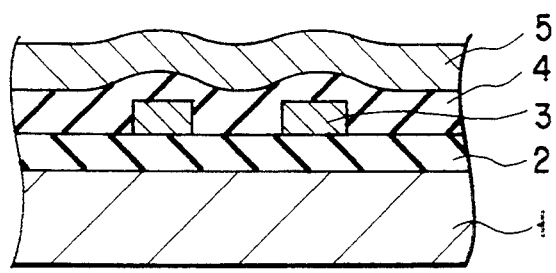

As shown in FIG. 4B, an 800-nm thick Al film (film to be processed or patterned) 5 serving as an upper wiring layer was deposited on the entire upper surface of the $SiO_2$ film 4.

Figure 4C:
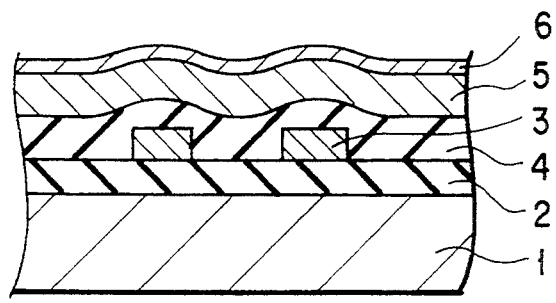

Subsequently, as shown in FIG. 4C, a carbon film 6 having a thickness of 50 nm was formed on the Al film 5. This carbon film 6 can be formed in an Ar atmosphere by a DC magnetron sputtering method using a graphite plate as a target. The conditions of formation are: room temperature, a pressure of $4 \times 10^{-3}$ Torr, a power density of 3.5 W/cm$^2$, and an Ar flow rate of 40 SCCM. When the structure of the carbon film 6 was checked by using X-ray diffraction, it was found that the structure was amorphous or microcrystalline. In addition, when optical constants of the carbon film 6 were measured by using an optical ellipsometer, it was found that when the wavelength of the exposure light was 365 nm, a refractive index n of 1.86 and an extinction coefficient of 0.79 were obtained. Furthermore, when the specific resistance of the carbon film 6 was measured by a four probe method, 0.3 $\Omega$cm was obtained.

Figure 4D:
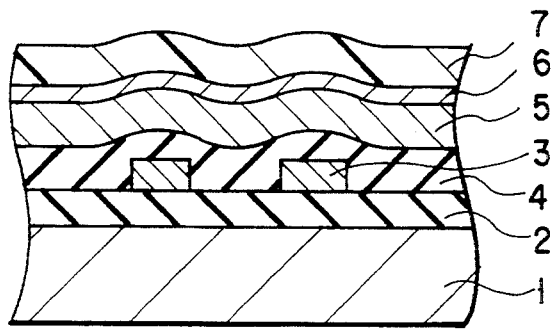

Subsequently, as shown in FIG. 4D, a 1.5-$\mu$m thick photoresist (photosensitive resin layer: RFI 15AA, manufactured by Sumitomo Chemical Co.) 7 was coated on the carbon film 6, and the photoresist 7 was exposed to light with a mask pattern (not shown). At this time, an exposure light wavelength $\lambda$ was set to be 365 nm.

Figure 4E:
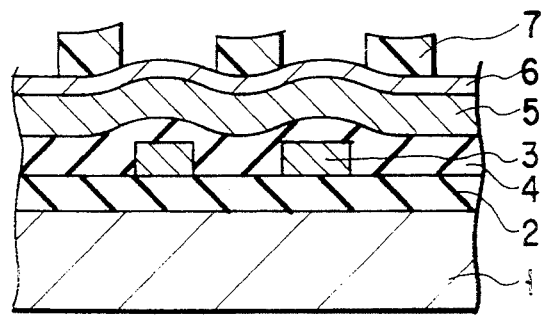

As shown in FIG. 4E, the photoresist 7 was developed by using a developing solution containing choline as a main component to form a photoresist pattern 7 having a width of 0.8 $\mu$m. When this photoresist pattern 7 was checked, it was found that the pattern 7 was substantially free from the influence of reflection by the Al film 5 in the process of exposure, and the mask pattern was faithfully transferred. When the carbon film 6 was checked, elution, peeling, and the like were not observed at all. In addition, when the Al film 5 was checked, corrosion by the alkaline developing solution was not observed at all. In contrast to this, when an Al film without the carbon film 6 was checked, corrosion by the developing solution was observed. This is because the Al film was not protected by the carbon film 6 unlike in this embodiment.

Figure 4F:
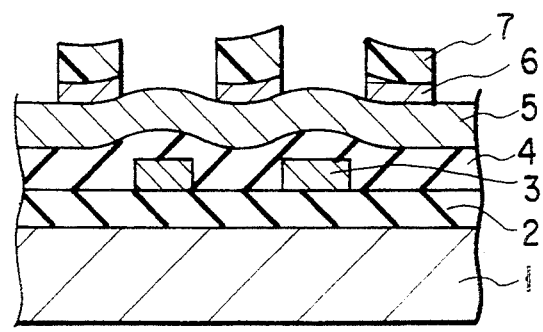
Figure 4G:
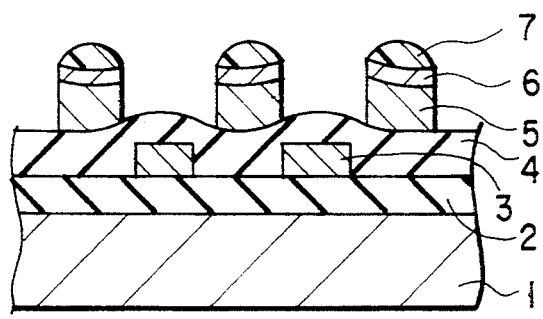

As shown in FIG. 4F, the carbon film 6 was patterned by the RIE method using an $O_2$ gas and the photoresist pattern 7 as a mask. Subsequently, as shown in FIG. 4G, the Al film 5 is patterned by the RIE method using a gas mixture of $BCl_3$ and $Cl_2$ to form Al wiring layer 5A.

Figure 4H:
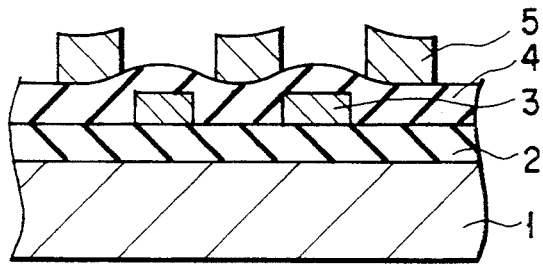

Finally, as shown in FIG. 4H, the photoresist pattern 7 was subjected to oxygen ashing, i.e., an ashing process using an oxygen plasma, thus simultaneously removing the photoresist pattern 7 and the carbon film 6.

FIGS. 5A and 5B are plan views showing wiring patterns respectively formed by this embodiment and a conventional method. Referring to FIGS. 5A and 5B, hatched portions indicate wiring patterns.

As shown in FIG. 5A, according to the method of this embodiment, no disconnected portions are observed in an Al wiring pattern 5, and hence it is apparent that the mask pattern can be faithfully transferred to the Al film.

In contrast to this, as shown in FIG. 5B, if an Al film is patterned by the conventional method, since exposure light is reflected by the surface of the Al film, the pattern transferred to the photoresist is distorted. For this reason, a large number of disconnected portions 8 are observed in the Al wiring pattern 5.

As described above, the Al wiring pattern formed by the method of this embodiment was substantially free from distortion and disconnection and hence was very good in quality. The reason for this is that the thickness of the carbon film 6 is set to such a value that the carbon film 6 absorbs light reflected by the Al film 5 to effectively reduce the amount of light which has reached the surface of the photoresist 7, and the light reflected by the interface between the carbon film 6 and the photoresist 7 and the light reflected by the interface between the carbon film 6 and the Al film 5 are counterbalanced by adjusting the phases of both the lights.

The present inventors compared the effect of a titanium nitride film as an antireflection film with that of a silicon film.

FIGS. 6 to 8 are graphs respectively showing the relationships between the thicknesses of a titanium nitride film, a silicon film, and a carbon film and the reflectivity of exposure light. An Al film was used as a film to be processed, and an exposure light wavelength of 365 nm was selected. Each reflectivity $\gamma$ was determined by using the following equation (2) considering the optical constants shown in Table 1 and multiple reflection.

TABLE 1

| Film | Wavelength | | | | | |
|---|---|---|---|---|---|---|
| | 365 nm | | 250 nm | | 440 nm | |
| | n | k | n | k | n | k |
| resist | 1.70 | 0.01 | 1.92 | 0.01 | 1.68 | 0.01 |
| carbon | 1.86 | 0.79 | 1.58 | 0.69 | 2.01 | 0.80 |
| Al | 0.41 | 3.58 | 0.20 | 2.31 | 0.57 | 4.28 |
| polycrystalline silicon | 6.60 | 2.00 | 1.60 | 3.61 | 4.81 | 0.29 |
| molybdenum silicide | 3.58 | 2.99 | 2.33 | 3.16 | 4.00 | 2.83 |
| Ag | 0.07 | 1.60 | 1.39 | 1.34 | 0.06 | 2.32 |
| Cu | 1.07 | 2.07 | 0.98 | 1.70 | 1.07 | 2.46 |
| Mo | 2.43 | 2.97 | 1.26 | 2.73 | 2.48 | 3.01 |
| SiO$_2$ | 1.50 | 0.00 | 1.52 | 0.00 | 1.46 | 0.00 |
| titanium nitride | 2.25 | 1.18 | 2.35 | 1.57 | 1.91 | 1.21 |

$$\gamma = \left| \frac{r_R + r_B \exp(-4\pi N_B d_{Bi}/\lambda)}{1 + r_B r_R \exp(-4\pi N_B d_{Bi}/\lambda)} \right|^2 \quad \ldots (2)$$

where $d_B$ is the thickness of a carbon film, $\lambda$ is the wavelength of exposure light, $N_A$ is the optical constant of Al film, $N_B$ is the optical constant of a carbon film, $N_R$ is the optical constant of a photosensitive resin layer, $r_R = (N_R - N_B)/(N_R + N_B)$, and $r_B = (N_B - N_A)/(N_B + N_A)$. The optical constant N is represented by $N = n - ik$ (n: refractive index, k: extinction coefficient, i: imaginary unit).

Note that the optical constants shown in Table 1 were measured by a spectral ellipsometer.

Each reflectivity was obtained on the basis of the intensity of light vertically radiated on a substrate through a photoresist and the intensity of light which was reflected by the surface of the film to be processed and vertically entered the photoresist again.

It is apparent from FIG. 6 that in the case of the titanium nitride film, the reflectivity is minimized to about 3%, with a film thickness being about 35 nm. Although the reflectivity is preferably reduced to about 5% or less in consideration of diffused reflection by the irregularities of the underlying layer, the range of film thicknesses in which this requirement can be satisfied is as narrow as 26 nm to 33 nm, resulting in difficulty in control or management of film thicknesses.

It is apparent from FIG. 7 that in the case of the silicon film, the reflectivity is minimized to about 5%, with a film thickness being about 5 nm. However, the range of film thicknesses in which this state can be achieved is very narrow, posing the same problem as that of the titanium nitride film. The reflectivity is minimized with the small film thickness being 5 nm because an antireflection effect is determined by the light absorption characteristics of the silicon film and interference of light in the silicon film. That is, since the refractive index of the silicon film is as large as about 6.6, the intensity of reflected light is minimized when the film thickness is very small.

In the case of the carbon film 6, as is apparent from FIG. 8, the range of film thicknesses in which the reflectivity is 5% or less is as wide as 38 nm to 78 nm, and the minimum value of the reflectivity is smaller than those of the titanium nitride film and the silicon film.

Using the above equation (2), the condition where the reflectivity is 5% or less, is determined by the following equation (1).

$$0.05 \geq \left| \frac{r_R + r_B \exp(-4\pi N_B d_{Bi}/\lambda)}{1 + r_B r_R \exp(-4\pi N_B d_{Bi}/\lambda)} \right|^2 \quad (1)$$

where $d_B$ is a thickness of a carbon film, $k$ is a wavelength of exposure light, $N_A$ is an optical constant of Al film, $N_B$ is an optical constant of a carbon film, $N_R$ is an optical constant of a photosensitive resin layer, $r_R = (N_R - N_B)/(N_R + N_B)$, and $r_B = (N_B - N_A)/(N_B + N_A)$.

The present inventors checked how the irregularities of a film to be processed affected the reflectivity.

FIG. 9 is a graph showing the relationship between the incidence angle of exposure light and its reflectivity in a case wherein an Al film having a smooth surface is used as a film to be processed, while the thickness of a carbon film and the wavelength of exposure light are respectively set to be 50 nm and 365 nm. That is, the reflectivity of a film (to be processed) having irregularities on its surface was checked.

It is apparent from FIG. 9 that the reflectivity is minimized when the incidence angle is 90°, i.e., there is no irregularities on the surface. However, even when the incidence angle is as small as 45°, the reflectivity is about 5%. That is, even if the surface of the film to be processed has irregularities, the carbon film effectively functions as an antireflection film.

According to this embodiment, therefore, the mask pattern can be transferred to the photoresist 7 without distortion by forming the carbon film 6 between the Al film 5 and the photoresist 7. In addition, a sufficiently high antireflection effect can be obtained by checking the thickness of the carbon film 6 and optical coefficients such as the refractive index n and the extinction coefficient k. Therefore, the patterning precision of the Al film 5 can be improved, and yield of products can be increased.

The carbon film 6 is removed at the same time that the resist pattern 7 is removed. That is, a new step of removing the carbon film 6 after etching of the Al film 5 is not required, and hence an increase in number of steps can be prevented.

In addition, since the carbon film 6 is chemically stable, even if the photoresist as a mask is partly etched upon etching of the Al film 5, the carbon film 6 serves as a mask. Therefore, etching can be performed with high precision. Al, resist, and carbon films were etched by the RIE method by using $Cl_2$ gas (flow rate: 30 SCCM) and $BCl_3$ gas (30 SCCM) at a pressure of 2 Pa and a power density of 1.5 W/cm$^2$, and the respective etching rates were compared. The etching rates of the Al, resist, and carbon films were 10 nm/sec, 3 to 5 nm/sec, and 0.4 nm/sec, respectively. It is found from this result that the carbon film can satisfactorily serve as a mask in etching. Therefore, the film to be processed may be etched using only carbon film as an etching mask.

In the above embodiment, an Al film is used as a film to be processed, and the wavelength of exposure light is set to be 365 nm. However, the same effect can be obtained by other types of films to be processed at other wavelengths of exposure light. FIGS. 10 to 26 show such cases.

Figure 15:
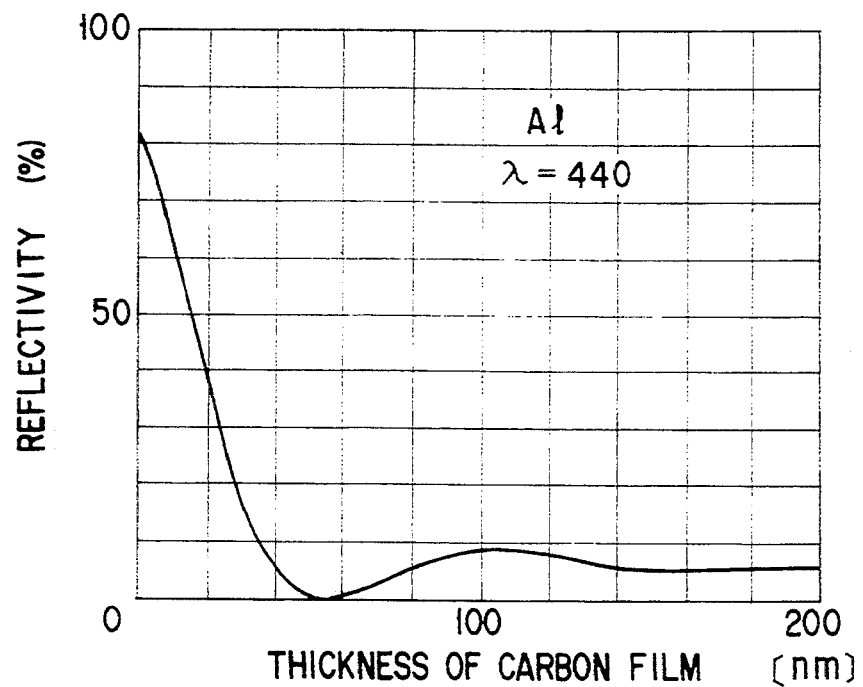
Figure 16:
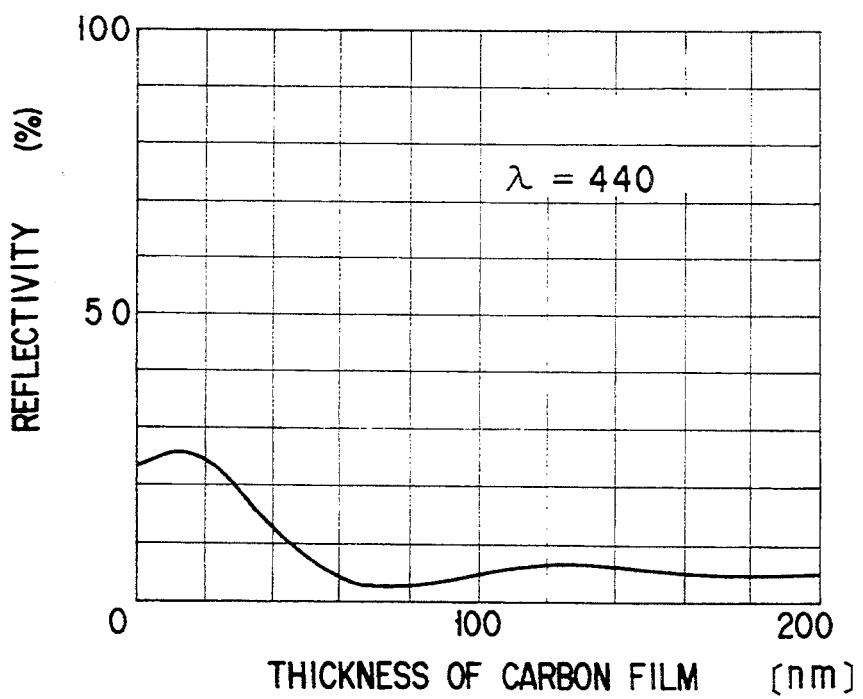
Figure 19:
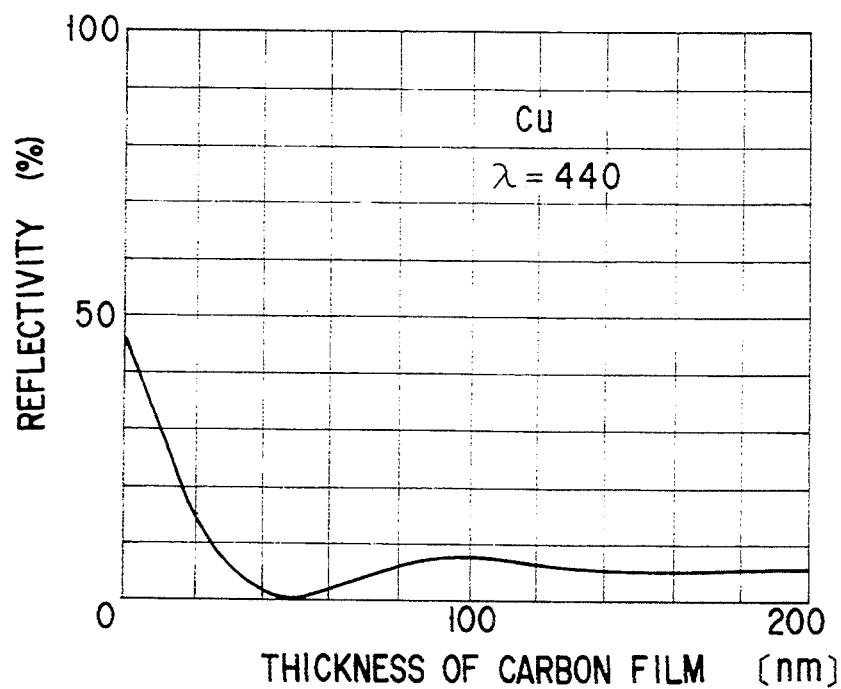
Figure 20:
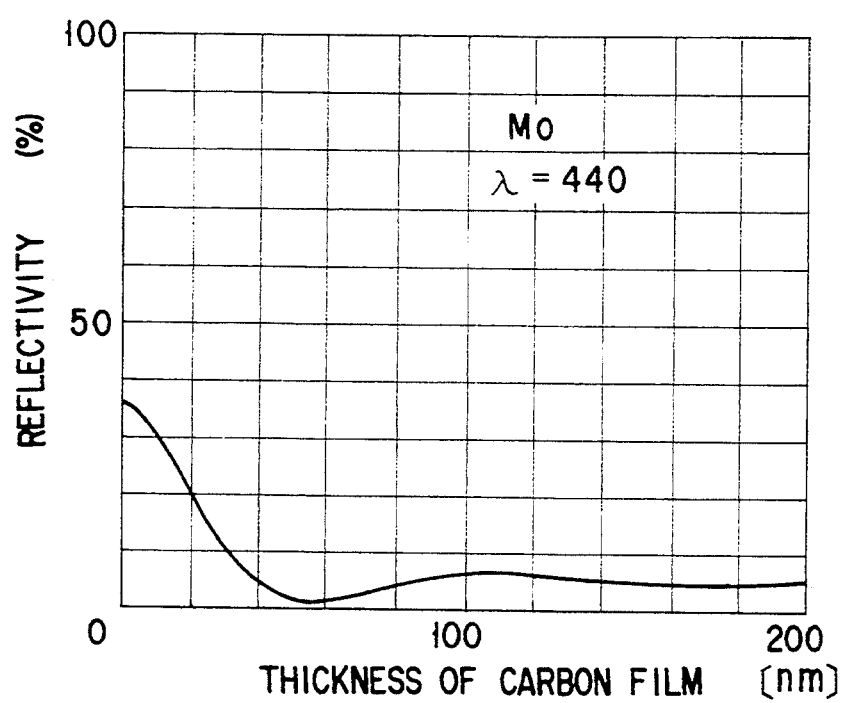
Figure 21:
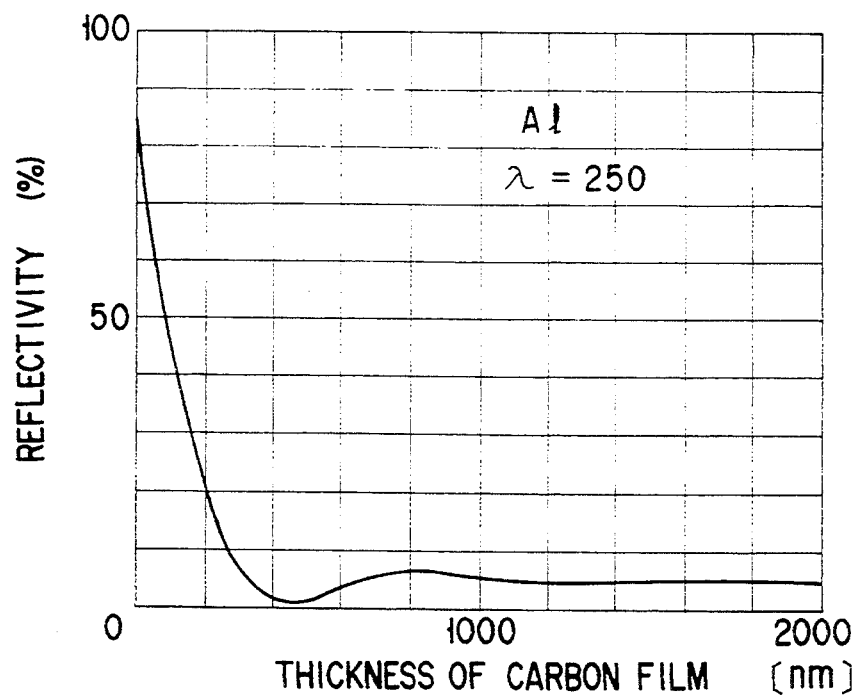
Figure 22:
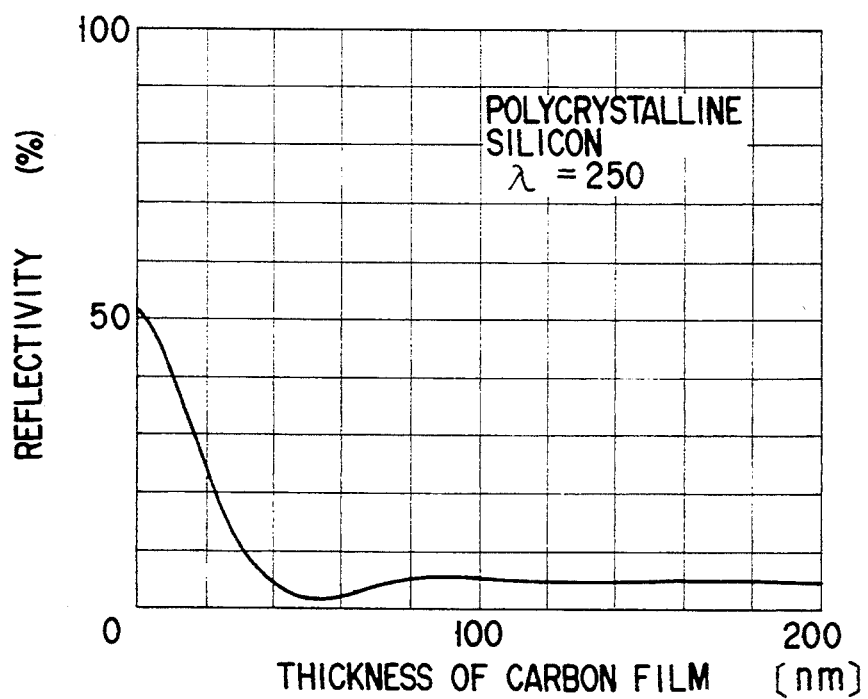
Figure 25:
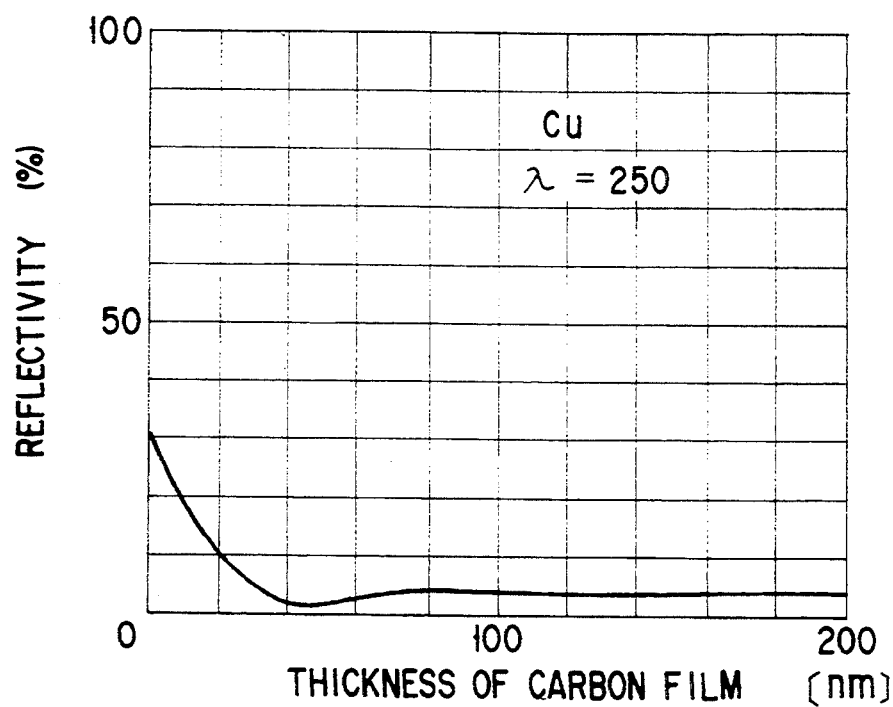
Figure 26:
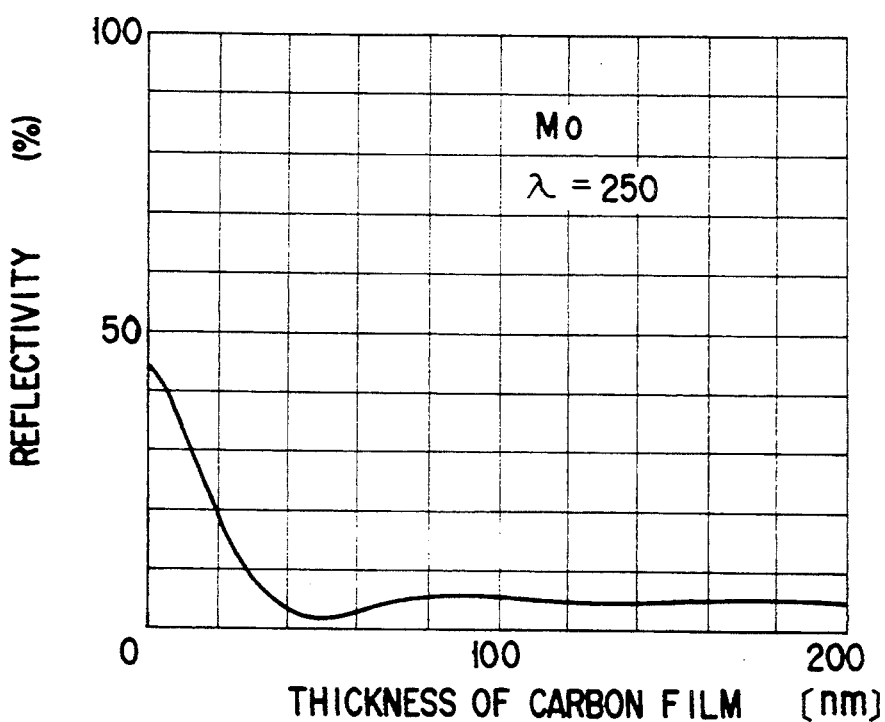
Figure 29:
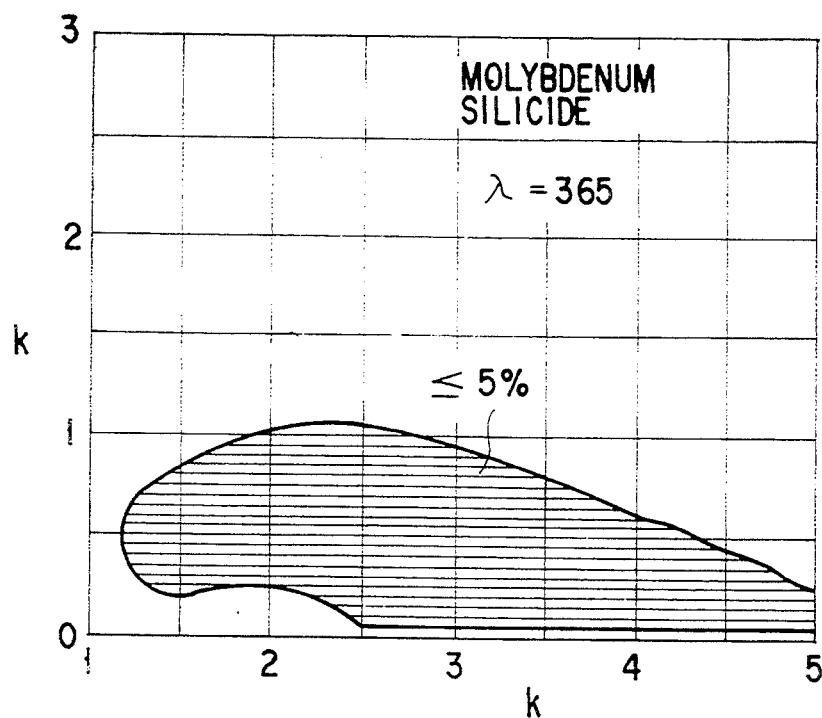
Figure 30:
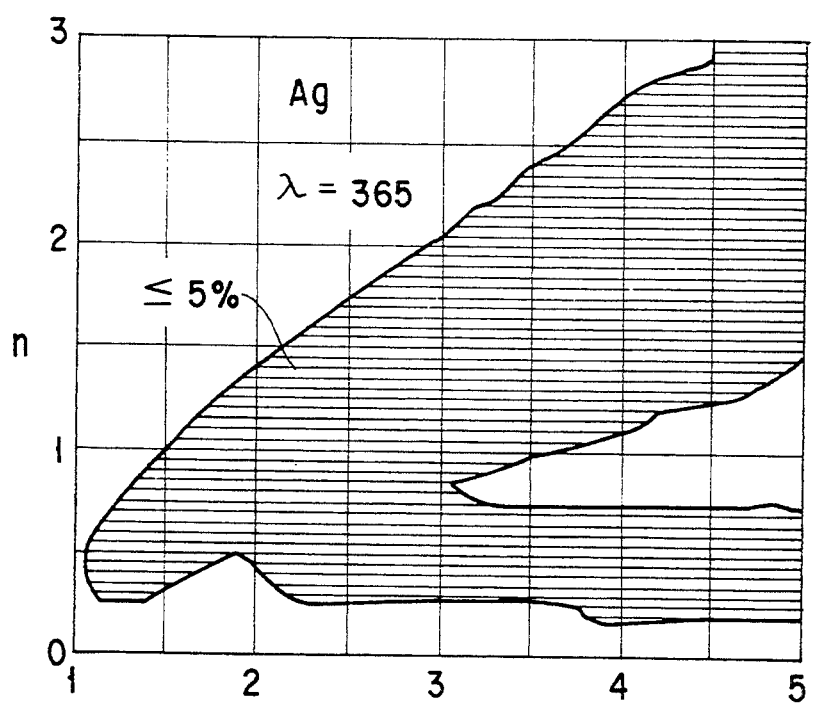
Figure 35:
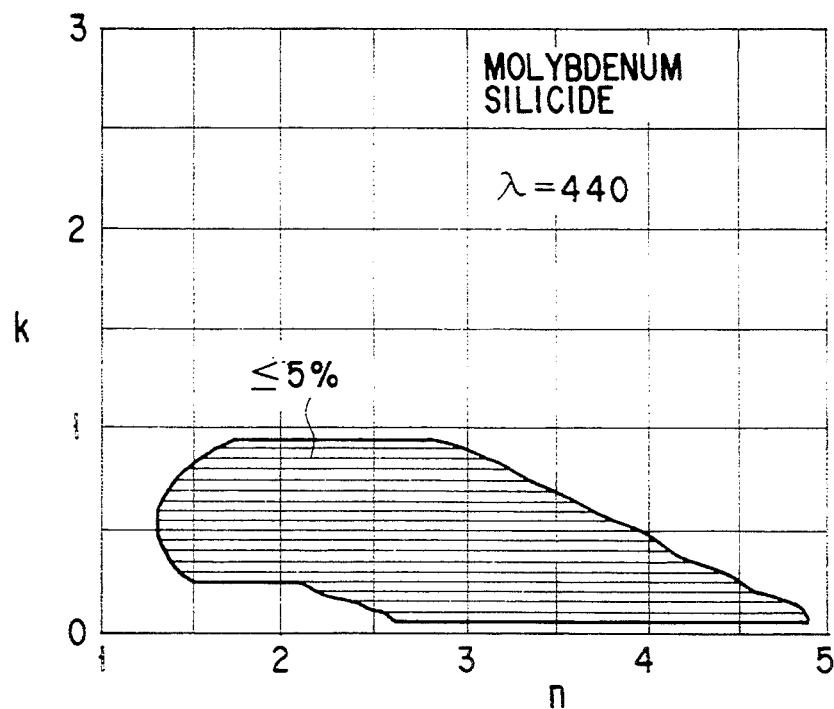
Figure 36:
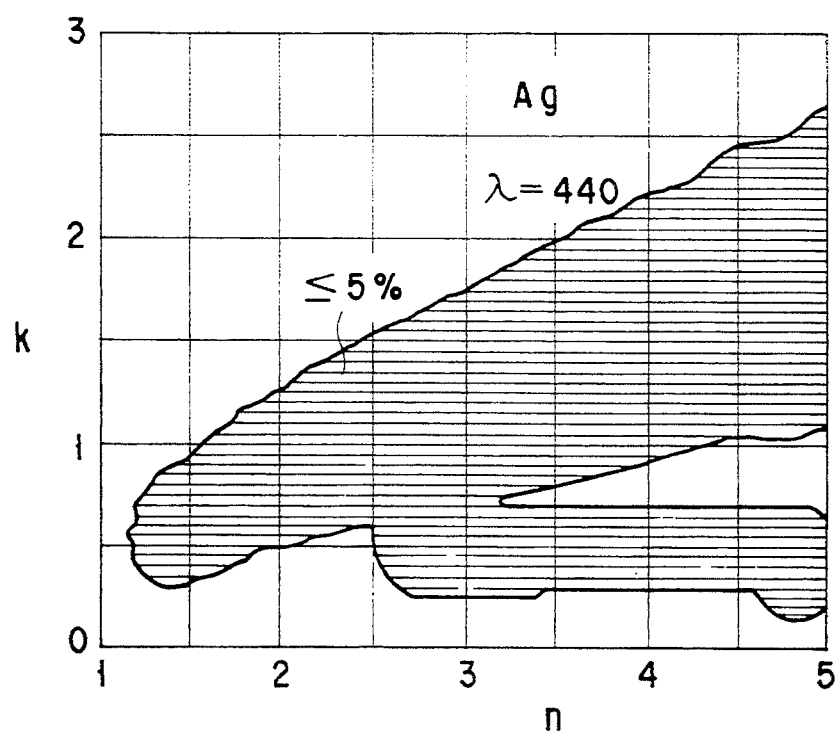

FIGS. 15 and 21 are graphs respectively showing the relationships between the thickness of a carbon film and the reflectivity of exposure light in cases wherein the wavelength of exposure light is set to be 440 nm and 250 nm, respectively, with an Al film being used as a film to be processed. Similarly, FIGS. 10, 16, and 22 are graphs respectively showing the relationships between the thickness of a carbon film and the reflectivity of exposure light in cases wherein the exposure light wavelength λ is set to be 365 nm, 440 nm, and 250 nm, respectively, with a polycrystalline silicon film being used as a film to be processed. FIGS. 11, 17, and 23 are graphs respectively showing the relationships between the thickness of a carbon film and the reflectivity of exposure light in cases wherein the exposure light wavelength λ is set to be 365 nm, 440 nm, and 250 nm, respectively, with a molybdenum silicide film being used as a film to be processed. FIGS. 12, 18, and 24 are graphs respectively showing the relationships between the thickness of a carbon film and the reflectivity of exposure light in cases wherein the exposure light wavelength λ is se to be 365 nm, 440 nm, and 250 nm, respectively, with an Ag film being used as a film to be processed. FIGS. 13, 19, and 250 are graphs respectively showing the relationships between the thickness of a carbon film and the reflectivity of exposure light in cases wherein the exposure light wavelength λ is set to be 365 nm, 440 nm, and 250 nm, respectively, with a Cu film being used as a film to be processed. FIGS. 14, 20, and 26 are graphs respectively showing the relationships between the thickness of a carbon film and the reflectivity of exposure light in cases wherein the exposure light wavelength λ is set to be 365 nm, 440 nm, and 250 nm, respectively, with an Mo film being used as a film to be processed.

Each reflectivity was estimated by using Table 1 and equation (2) used in the above-described case of the Al film.

It is apparent from FIGS. 7 to 12 that when the exposure light wavelength λ is 365 nm, the reflectivity of each film to be processed is minimized and the range in which a reflectivity of 5% or less is obtained is wide, with the thickness of the carbon film being set to be less than 100 nm. In addition, it is apparent from FIGS. 13 to 18 that when the exposure light wavelength λ is 440 nm, the minimum reflectivity can be obtained and a reflectivity of 5% is obtained in a wide range, with the thickness of the carbon film being set to be less than 100 nm. Similarly, it is apparent from FIGS. 19 to 24 that when the exposure light wavelength λ is 250 nm, the minimum reflectivity is obtained and a reflectivity of 5% is obtained in a wide range, with the thickness of the carbon film being set to be less than 100 nm.

As is apparent from the above results, with any film to be processed and any exposure light wavelength, the minimum reflectivity can be obtained and a reflectivity of 5% or less is obtained in a wide range when the thickness of the carbon film is less than 100 nm, and a high antireflection effect which cannot be obtained with a carbon film having a thickness of 100 nm or more can be obtained.

The present inventors checked the range of the refractive index x and extinction coefficient k of a carbon film in which a reflectivity of 5% or less was obtained with a carbon film having a thickness of less than 100 nm, in cases wherein the above-mentioned films to be processed (Al, polycrystalline silicon, molybdenum silicide, Ag, Cu, and Mo films) were used. FIGS. 17 to 44 show the results.

FIGS. 27, 33, and 39 are graphs respectively showing the ranges of the refractive index n and extinction coefficient k of a carbon film in which a reflectivity of 5% or less is obtained when an Al film is used as film to be processed, in cases wherein the exposure light wavelength λ is set to be 365 nm, 440 nm, and 250 nm, respectively. Similarly, FIGS. 28, 34, and 40, FIGS. 29, 35, and 41, FIGS. 30, 36, and 42, and FIGS. 32, 38, and 44 respectively show the ranges of the refractive index n and extinction coefficient k of a carbon film in which a reflectivity of 5% or less is obtained, in cases wherein a molybdenum silicide film, an Ag film, a Cu film, and an Mo film are respectively used as films to be processed, with the exposure light wavelength λ being set to be 365 nm, 440 nm, and 250 nm, respectively. Note that each reflectivity was estimated by using the optical constants shown in Table 1 and equation (2) established in consideration of multiple reflection.

It is apparent from FIGS. 27 to 32 that when the exposure light wavelength λ is 365 nm, a reflectivity of 5% or less can be obtained by any film to be processed as long as the refractive index n is 1.3 or more and the extinction coefficient k is 1.0 or less. In addition, it is apparent from FIGS. 33 to 38 that when the exposure light wavelength λ is 440 nm, a reflectivity of 5% or less can be obtained if the refractive index n is 1.3 or more and 2.5 or less, and the extinction coefficient is 0.3 or more and 1.0 or less. Similarly, it is apparent from FIGS. 39 to 44 that when the exposure light wavelength λ is 250 nm, a reflectivity of 5% or less can be obtained if the refractive index n is 1.3 or more and 2.5 or less, and the extinction coefficient k is 0.3 or more and 1.0 or less. When Al—Si—Cu, Al—Si or tungsten silicide is used, the similar result can be obtained.

As is apparent from the above results, in order to sufficiently decrease the reflectivity, certain limitations must be posed on the optical constants of a carbon film. It is, however, found that if the refractive index n is 1.3 or more or 2.5 or less, and the extinction coefficient k is 0.3 or more or 1.0 or less, the reflectivity can be suppressed to 5% or less and a high antireflection effect can be obtained with any film to be processed and any value of the exposure light wavelength λ. A carbon film having a diamond structure can be presented as an example of a carbon film which falls outside the range described above. Since the extinction coefficient k of a carbon film having a diamond structure becomes substantially 0 when the exposure light wavelength λ is 200 nm or more, its antireflection effect is very small.

Furthermore, in addition to the above-described films to processed, a metal film, an alloy film, a silicide film, and a semiconductor film may be used. For example, metallic compound films such as an Al—Si—Cu film, an Al—Si film, an MoSi$_x$ film, and a WSi$_x$ film may be used.

As has been describe, the present invention achieves a great advantage when a metal film, an alloy film, a silicide film, a semiconductor film, or the like is used as film to be processed.

The thickness of the carbon film used in the invention can be set in the following way.

The thicker the carbon film, the lower the reflectivity of the film. The reflectivity has the lowest value when the film is less than 100 nm thick. As the thickness of the film is reduced, the reflectivity approaches the value specific to carbon. The specific reflectivity of carbon is defined as the reflectivity which the carbon film has when its thickness is indefinitely great. Hence, it suffices to set the thickness of the carbon film at value which imparts the film a reflectivity ranging from a minimum value upwards, but less than a maximum value. To increase the etching accuracy as much as possible, it is desirable that the film has a thickness of less than 100 nm.

In particular, it is preferable that the carbon film have such a thickness as would give the film a reflectivity lower than the value specific to carbon (e.g., stable at about 5% in the case shown in FIG. 8).

In the thickness of the carbon film is set at a value which imparts the film a reflectivity ranging from a minimum value upwards, but not equal to a maximum value, the carbon film will attain a sufficient antireflection effect and will help to raise the etching accuracy.

FIGS. 45A to 45G are sectional views showing the steps in forming contact holes in an insulating film according to the second embodiment of the present invention.

As shown in FIG. 45A, a 1-$\mu$m thick $SiO_2$ film 12 was formed on an Si substrate 11 on which elements (not shown) were formed. Thereafter, an 800-nm thick Al wiring layer (light-reflective film) 13 was formed on the $SiO_2$ film 12.

As shown in FIG. 45B, a 1-$\mu$m thick $SiO_2$ film 14 was formed, as an inter-layer insulating layer, on the entire upper surface of the resultant structure. In this case, a step is formed on the upper surface of the $SiO_2$ film 14 in correspondence with the Al wiring layer 13.

As shown in FIG. 45C, an 80-nm thick carbon film 15 was formed on the $SiO_2$ film (film to be processed) 14. This carbon film 15 can be formed in an Ar atmosphere by the DC magnetron sputtering method using a graphite plate as a target. The conditions of formation are: room temperature, a pressure of $4 \times 10^{-3}$ Torr, a power density of 3.5 W/cm$^2$, and an Ar flow rate of 40 SCCM. When the structure of the carbon film 15 was checked by using X-ray diffraction, it was found that the structure was amorphous or microcrystalline. In addition, when optical constants of the carbon film 15 were measured by using an optical ellipsometer, it was found that when the wavelength of the exposure light was 365 nm, the refractive index n was 1.86 and the extinction coefficient k was 0.79 were obtained. Furthermore, when the specific resistance of the carbon film 15 was measured by a four probe method, 0.3 $\Omega$cm was obtained.

Subsequently, as shown in FIG. 45D, a positive photoresist (photosensitive resin layer: PFI 15AA, manufactured by Sumitomo Chemical Co.) 16 having a thickness of 1.5 $\mu$m was coated on the carbon film 15, and the photoresist 16 was exposed to light with a mask pattern (not shown). The mask pattern was constituted by square contact holes of 0.5 $\mu$m$^2$ and 0.7 $\mu$m$^2$. An exposure light wavelength was 365 nm.

As shown in FIG. 45E, the photoresist 16 was developed by using a developing solution containing choline as a main component to form a photoresist pattern 16. When this photoresist pattern 16 was checked, it was found that the pattern 16 was substantially free from the influence of reflection by the Al wiring layer 13 and the substrate 11 in the process of exposure, and hence the mask pattern was faithfully transferred. In addition, when the carbon film 15 was checked, it was found that elution, peeling, and the like were not observed at all.

As shown in FIG. 45F, the carbon film 15 was patterned by the RIE method using $O_2$ gas and the photoresist pattern 16 as a mask. Subsequently, the $SiO_2$ film 14 was patterned by the RIE method using $CF_4$ gas.

Finally, as shown in FIG. 45G, the photoresist pattern 16 and the carbon film 15 were simultaneously removed by an ashing process using an oxygen plasma.

In this embodiment, the mask pattern constituted by the square contact holes of 0.5 $\mu$m$^2$ and 0.7 $\mu$m$^2$ was used. The pattern transferred to the photoresist 16 had square contact holes of 0.48 $\mu$m$^2$ and 0.7 $\mu$m$^2$. A variation in size of the contact holes of 0.7 $\mu$m$^2$ within the surface of a 6-inch wafer was $\pm 1.8\%$.

For comparison with the above-described structure, patterning of an insulating film was performed without forming a carbon film between a photoresist and an $SiO_2$ film. It was found that a resolution corresponding to a 0.50-$\mu$m$^2$ pattern could not obtained, and a variation in size of 0.70-$\mu$m$^2$ contact holes within the surface of a 6-inch wafer was as large as $\pm 8.8\%$.

The following are considered to be the reasons why the mask pattern was faithfully transferred to the photoresist 16.

The intensity of light which has passed through the photoresist 16 and has been reflected by the substrate 11 and Al wiring layer 13 is decreased in the carbon film 15. As a result, the intensity of light reflected by the substrate 11 and the wiring layer 13 is sufficiently decreased, and almost no abnormal exposure is caused by this reflected light. In addition, since the reflectivity of the carbon film 15 is low, the photoresist 16 is substantially free from abnormal exposure by light reflected by the surface of the carbon film 15. Furthermore, since the intensity of the reflected light is low, even if the thickness of an insulating film changes depending on the position, and the phase of the reflected light shifts, the size of a resist pattern does not change.

According to the second embodiment, therefore, the distortion of the pattern transferred to the photoresist 16 is reduced, and the resolution is increased. In addition, a stable, uniform, accurate photoresist pattern can be formed regardless of the thickness of the $SiO_2$ film 12, achieving high-precision, high-reliability patterning of the $SiO_2$ film 14.

FIGS. 46A to 46E are sectional views showing the steps in forming an insulating film pattern according to the third embodiment of the present invention.

Figure 46A:
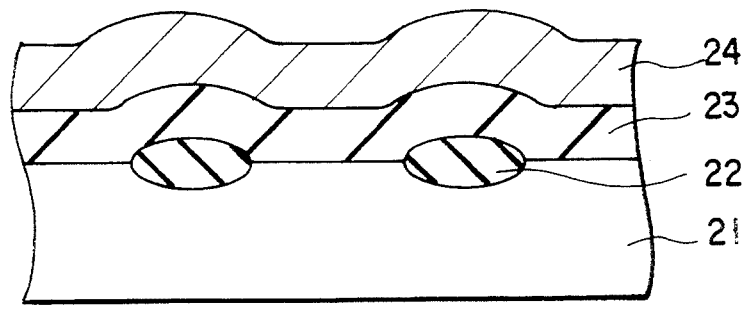
FIGS. 46A to 46E are sectional views showing the process of forming an insulating film pattern according to the third embodiment of the present invention.

As shown in FIG. 46A, the upper surface of an Si substrate 21 was selectively oxidized to form an $SiO_2$ film 22 having a thickness of 1 $\mu$m. Thereafter, an 800-nm thick $SiO_2$ film 23 and a 1-$\mu$m thick polycrystalline silicon film (light-reflective film) 24 were sequentially formed on the substrate 21 on which the $SiO_2$ film 22 was formed. In this case, a step is formed on the surface of the polycrystalline silicon film 24 in correspondence with the $SiO_2$ film 22.

Figure 46B:
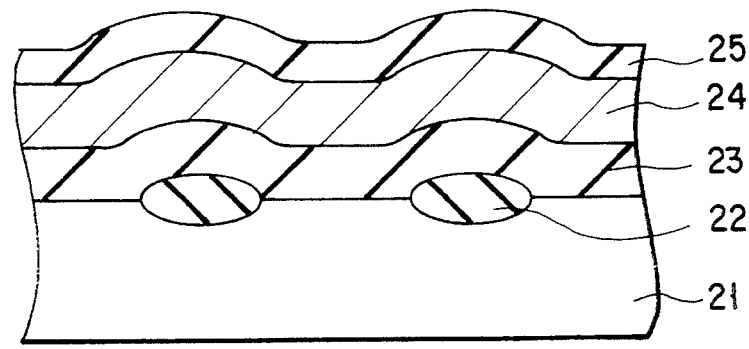

As shown in FIG. 46B, an $SiO_2$ film 25 (film to be processed) 25 having a thickness of 300 nm was deposited on the polycrystalline silicon film 24.

Figure 46C:
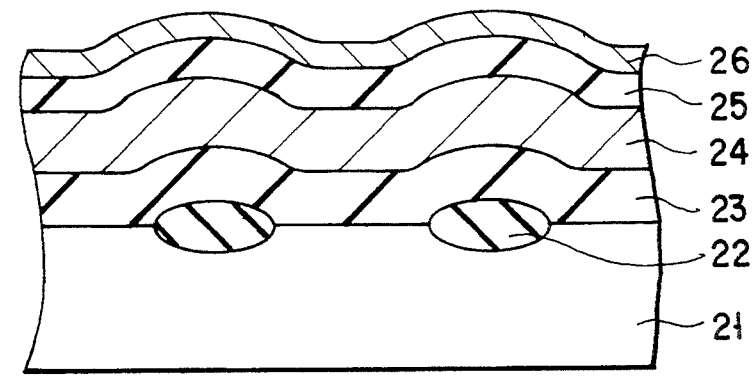

Subsequently, as shown in FIG. 46C, an 80-nm thick carbon film 26 was deposited on the $SiO_2$ film 25.

Figure 46D:
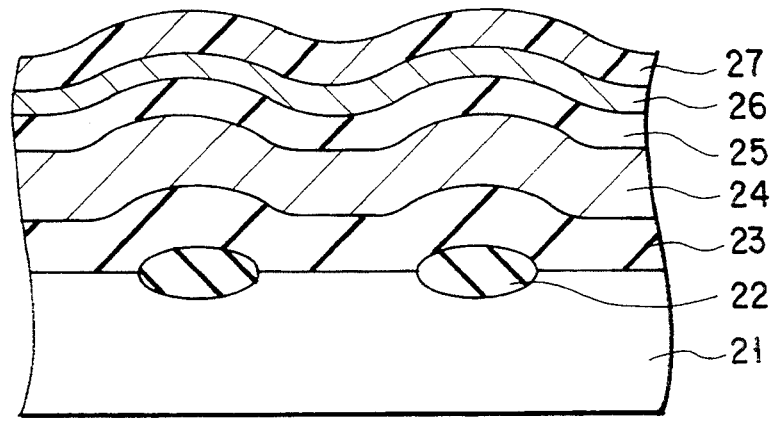

As shown in FIG. 46D, a positive photoresist (photosensitive resin layer: PFI is 15AA, manufactured by Sumitomo Chemical Co.) 27 having a thickness of 1.5 $\mu$m was coated on the carbon film 26, and the photoresist 27 was exposed with a wiring mask pattern (not shown). In this case, the wavelength of exposure light was set to be 365 nm.

Figure 46E:
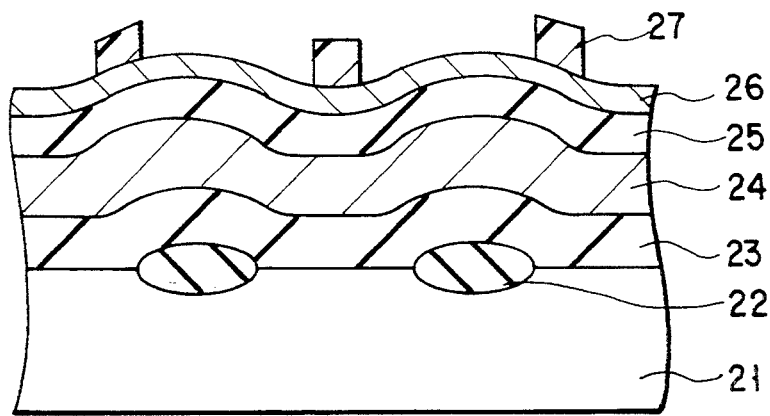

As shown in FIG. 46E, the photoresist 27 was developed by using a developing solution to form photoresist pattern 27 having a width of 0.8 μm. As will be described below, when this photoresist pattern 27 was checked, it was found that the pattern 27 was substantially free from the influence of light reflected by the polycrystalline silicon film 24, and the mask pattern was faithfully transferred.

Finally, the carbon film 26 and the SiO$_2$ film 25 were etched by using the photoresist pattern 27 as a mask, and the carbon film 26 and the photoresist pattern 27 were removed by an ashing process.

Figure 47A:
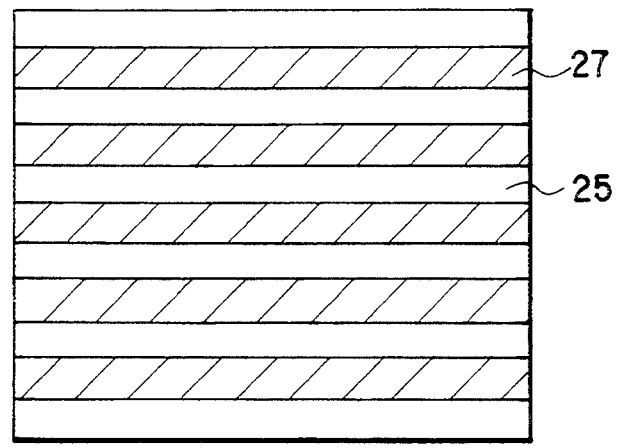
FIGS. 47A and 47B are plan views showing insulating film patterns respectively obtained by a method of the third embodiment and a conventional method.
Figure 47B:
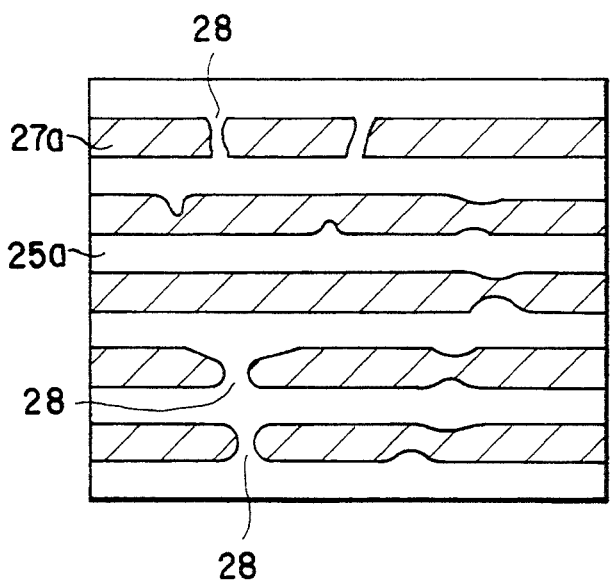

FIGS. 47A and 47B are plan views showing photoresist patterns respectively formed by the method of this embodiment and the conventional method. Referring to FIGS. 47A and 47B, hatched portions indicate photoresist patterns.

As shown in FIG. 47A, according to the method of the embodiment, no disconnected portions are observed in the photoresist pattern 27, and it is apparent that the mask pattern can be faithfully transferred to the photoresist 27.

In contrast to this, as shown in FIG. 47B, when a photoresist 27a was patterned by the conventional method, a large number of disconnected portions 28 were observed in a photoresist pattern 27a, particularly, at the position with high step. This is because, in the conventional method, a distorted pattern is transferred to the photoresist 27a due to exposure light reflected by the surface of the polycrystalline silicon film 24. Note that reference numeral 25a denotes an inter-layer insulating layer.

The following are considered to be the reasons why the mask pattern can be faithfully transferred to the photoresist 27.

Since the intensity of light which has passed through the photoresist 27 and has been reflected by the polycrystalline silicon 24 is decreased in the carbon film 26, and the intensity of light reflected by the substrate 21 and the polycrystalline silicon 24 is sufficiently decreased, the photoresist 27 is hardly abnormally exposed by this reflected light. In addition, even if the thickness of the insulating film changes depending on the position, and the phase of the reflected light shifts, the size of the resist pattern does not change.

According to this embodiment, therefore, by forming the carbon film 26 between the SiO$_2$ film 25 and the photoresist 27, the distortion of the mask pattern transferred to the photoresist 27 can be reduced, and the resolution can be increased. In addition, even if the thickness of the SiO$_2$ film 25 or the carbon film 26 as an underlying layer is not uniform, a stable, uniform, accurate photoresist pattern can be formed. Therefore, high-precision, high-reliability patterning of the photoresist 27 can be realized, the SiO$_2$ film 25 or polycrystalline silicon film 24 as an underlying layer can be processed with high accuracy, and the yield of products can be increased.

In each of the second and third embodiments, the 80-nm thick carbon film is exemplified. However, the present inventors confirmed that if the thickness of a carbon film was set to be 80 nm or more, the intensity of reflected light could be sufficiently reduced.

Figure 48:
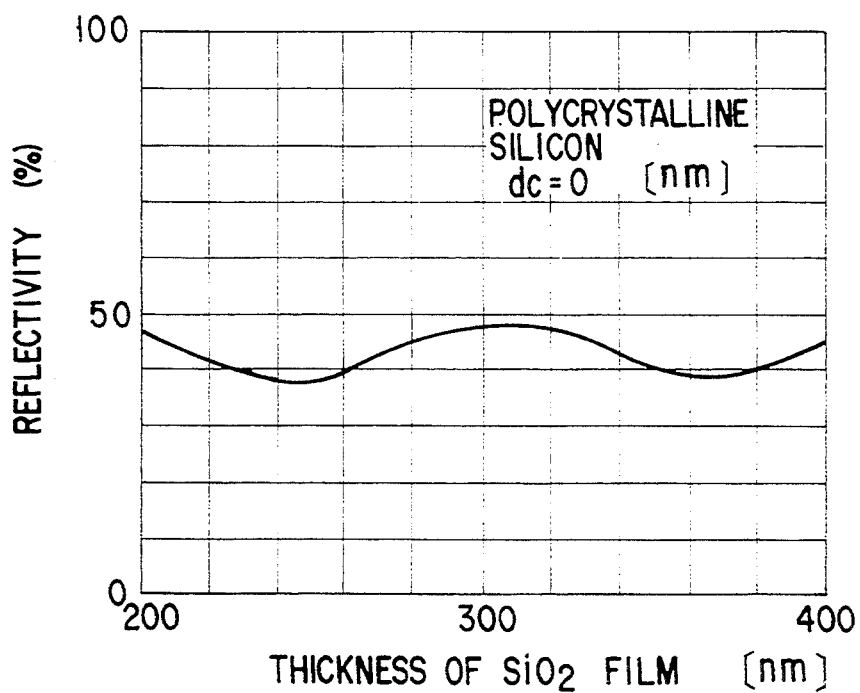
Figure 49:
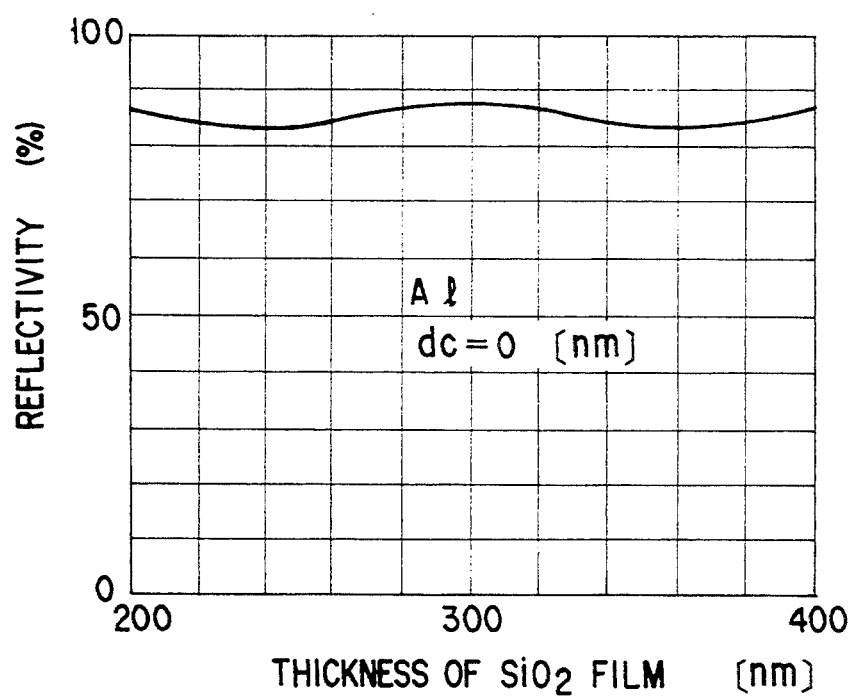
Figure 52:
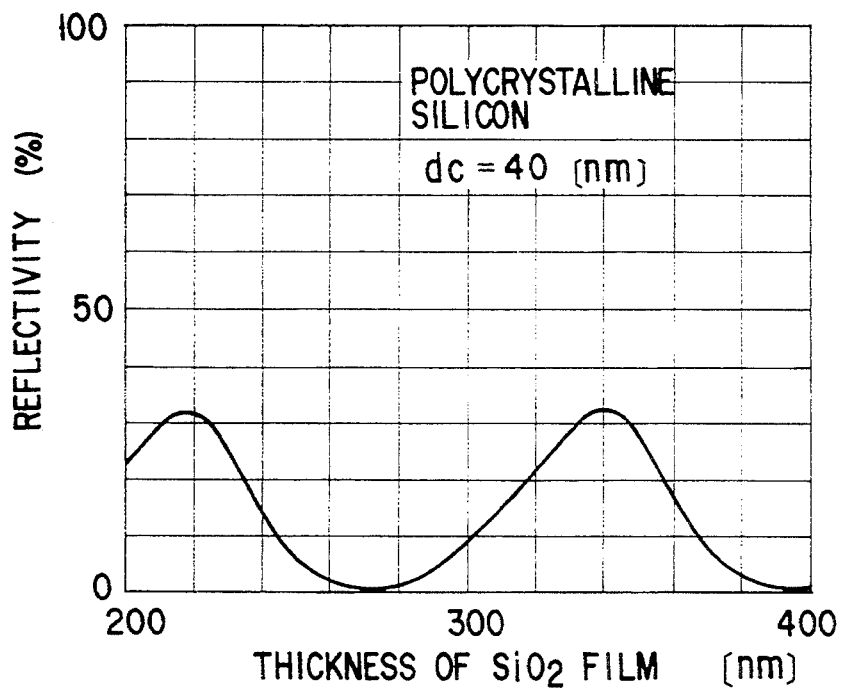
Figure 53:
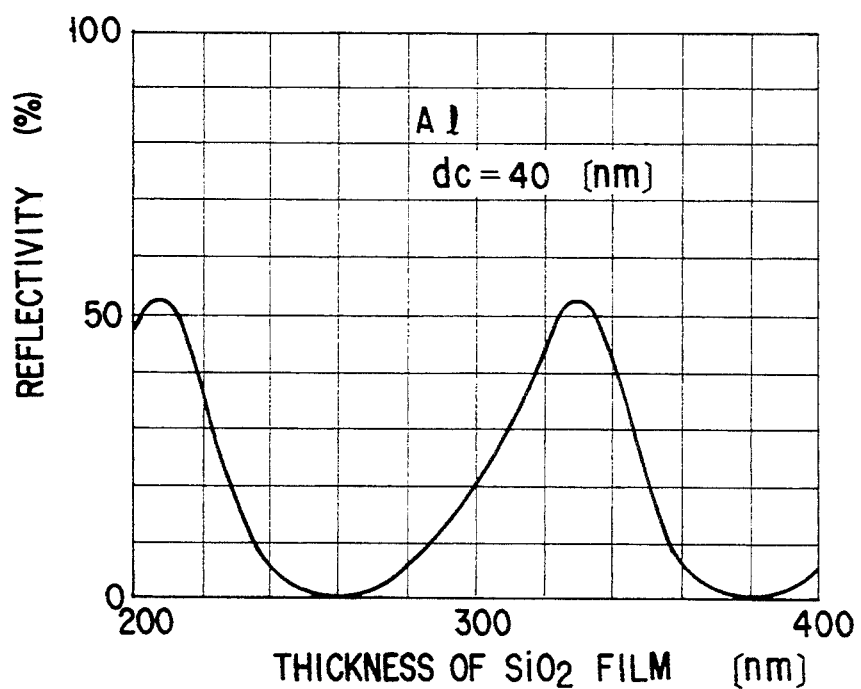

FIGS. 48 to 59 show graphs on which the above confirmation is based. FIGS. 48 and 49 are graphs respectively showing the relationships between the thickness of an SiO$_2$ film and the reflectivity (the ratio of the intensity of incident light in the resist film to the intensity of reflected light) in cases wherein a polycrystalline silicon film and an Al film are respectively formed on the SiO$_2$ film with a thickness d of a carbon film being set to be 0 nm (i.e., without a carbon film). Similarly, FIGS. 50 and 51 are graphs respectively showing the relationships between the thickness of an SiO$_2$ and the reflectivity with the thickness of a carbon film being set to be 20 nm. FIGS. 52 and 53 are graphs respectively showing the relationships between the thickness of an SiO$_2$ film and the reflectivity with the thickness of a carbon film being set to be 40 nm. FIGS. 54 and 55 are graphs respectively showing the relationships between the thickness of SiO$_2$ film and the reflectivity with the thickness of a carbon film being set to be 60 nm. FIGS. 56 and 57 are graphs respectively showing the relationships between the thickness of an SiO$_2$ film and the reflectivity with the thickness of a carbon film being set to be 80 nm. FIGS. 58 and 59 are graphs respectively showing the relationships between the thickness of an SiO$_2$ film and the reflectivity with the thickness of a carbon film being set to be 100 nm.

Note that each reflectivity was determined by setting the exposure light wavelength λ=364 nm and using the optical constants shown in Table 1 and the following formula (3) established in consideration of multiple reflection.

$$0.05 \geq \left| \frac{r_R + R\exp(-4\pi N_C d_C i/\lambda)}{1 + r_R R\exp(-4\pi N_C d_C i/\lambda)} \right|^2 \quad (3)$$

$$R = \left| \frac{r_C + r_B\exp(-4\pi N_B d_B i/\lambda)}{1 + r_B r_C\exp(-4\pi N_B d_B i/\lambda)} \right|^2$$

where $d_B$ is the thickness of an SiO$_2$ film, $d_C$ is the thickness of a carbon film, λ is the wavelength of exposure light, $N_A$ is the optical constant of a light-reflective film (polycrystalline silicon film, Al film), $N_C$ is the optical constant of the carbon film, $N_B$ is the optical constant of the SiO$_2$ film, NR is the optical constant of a photoresist, $r_R = (NR - N_C)/(NR + N_C)$, $r_C = (N_C - N_B)/(N_C + N_B)$, and $r_B = (N_B - N_A)/(N_B - N_A)$. Note that the optical constant N is represented by N=n−ik (n: refractive index, k: extinction coefficient).

It is apparent from these graphs that when the thickness $d_C$ of the carbon film is 80 nm or more, a reflectivity of 10% or less is obtained regardless of the polycrystalline silicon film or the Al film or the thickness $d_B$ of the SiO$_2$ film.

In addition, it is apparent from these graphs that the reflectivity periodically changes in accordance with the thickness $d_B$ of the SiO$_2$ film. This change in reflectivity is caused by the interference between reflected light and incident light on the surface of the polycrystalline silicon or Al film, the interference between reflected light and incident light on the surface of the SiO$_2$ film, the interference between light reflected by the surface of the carbon film and light reflected by the surface of the polycrystalline silicon or Al film, or the like. The period of change corresponds to ½ a value obtained by dividing the wavelength of incident light by the refractive index of the SiO$_2$ film, i.e., about 120 nm. It is apparent that such periodical change in reflectivity is very small when the thickness $d_C$ of the carbon film is 80 nm or more.

The present inventors also checked the dependency of light absorption, of a carbon film, on its thickness. FIG. 60 shows the result. More specifically, FIG. 60 is a graph showing the relationship between an absorbance $I/I_0$ and the thickness of a carbon film. In this case, I represents the intensity of transmitted light; and $I_0$, the intensity of incident light.

Provided that the thickness and extinction coefficient of a carbon film are respectively represented by d and k, and the wavelength of light is represented by $\lambda$, the absorbance $I/I_0$ is given by:

$$I/I_0 = exp(-4\pi kd/\lambda) \quad (4)$$

FIG. 60 shows the case wherein k=0.79 and $\lambda$=365 nm.

Although FIG. 60 shows the carbon film thickness dependency of the absorbance $I/I_0$, it is apparent from equation (3) that the absorbance $I/I_0$ also depends on the extinction coefficient k and the wavelength $\lambda$. Therefore, the reflectivity can be decreased to 10% or less even when the thickness of the carbon film is less than 80 nm, even though it is described with reference to FIGS. 48 to 59 that the reflectivity is decreased to 10% or less when the thickness of the carbon film is 80 nm or more.

More specifically, substitutions of d=80, k=0.79, and $\lambda$=365 into kd/$\lambda$ yield 0.173. Therefore, as long as kd/$\lambda \geq 0.173$ is satisfied, the intensities of light reflected by the respective types of light-reflective films can be suppressed to substantially the same value regardless of changes in optical constant of a light-reflective film as an underlayer such as a polycrystalline silicon film or an Al film, of a transparent film such as an SiO$_2$ film, and of a carbon film, and changes in wavelength of exposure light. Hence, excellent patterning can be performed as in the above-described embodiments. However, a carbon film whose extinction coefficient k is substantially 0 with the wavelength $\lambda$ of 200 nm or more, i.e., a diamond film does not satisfy the above relation and hence cannot be used.

In the second and third embodiments, a polycrystalline silicon film or an Al film is used as a light-reflective film. However, other metal films, alloy films, silicide films, and semiconductor films can be used. In addition, although an SiO$_2$ film as an insulating film is exemplified as a transparent film to be processed, other oxide films and nitride films as transparent insulating films can be used.

FIGS. 61A to 61I are sectional views showing the steps in forming an insulating film pattern according to the fourth embodiment of the present invention.

Figure 61A:
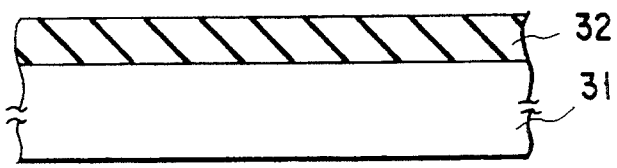
FIGS. 61A to 61E are sectional views showing the process of forming an insulating film pattern according to the fourth embodiment of the present invention.

As shown in FIG. 61A, an SiO$_2$ film (film to be processed) 32 having a thickness of 1 $\mu$m was formed on an Si substrate (light-reflective film) 31, on which desired elements were formed, by the plasma CVD method. The SiO$_2$ film 32 has a variation of ±8% in film thickness.

Figure 61B:
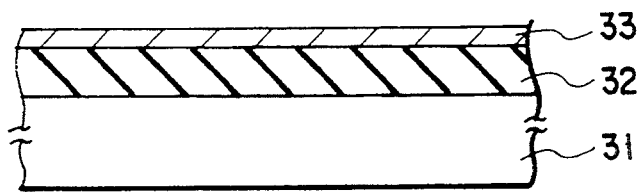

As shown in FIG. 61B, a 100-nm thick carbon film 33 was formed on the SiO$_2$ film 32 by the sputtering method using a graphite plate as a target.

Figure 61C:
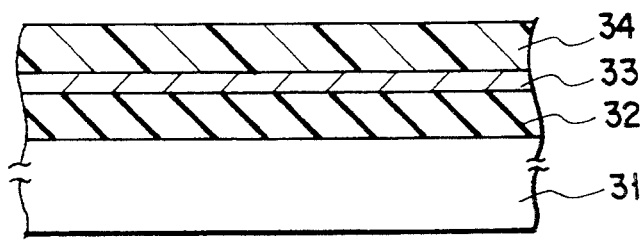

Subsequently, as shown in FIG. 61C, a positive photoresist (photoresist resin: RFI 15AA, manufactured by Sumitomo Chemical Co.) 34 was coated on the carbon film 33, and the photoresist 34 was exposed with a mask pattern (not shown). In this step, the exposure light wavelength $\lambda$ was set to be 365 nm.

Figure 61D:
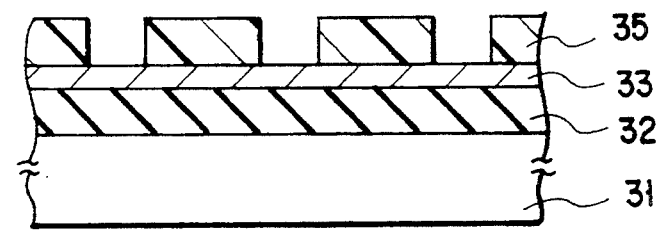

As shown in FIG. 61D, the photoresist 34 was developed to form a photoresist pattern 35.

Figure 61E:
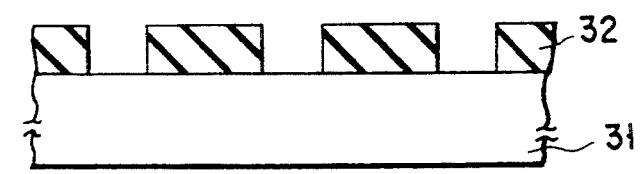

Finally, as shown in FIG. 61E, the carbon film 33 and the insulating film 32 were patterned by using the photoresist pattern 35 as a mask, and the photoresist pattern 35 and the carbon film 33 were removed by an ashing process.

In the above-described method, the mask pattern was constituted by square contact holes of 0.5 $\mu$m$^2$ and 0.7 $\mu$m$^2$. The pattern transferred to the photoresist 34 had square contact holes of 0.48 $\mu$m$^2$ and 0.7 $\mu$m$^2$. A variation in size of the contact holes of 0.7 $\mu$m$^2$ within the surface of a 6-inch wafer was ±1.8%.

For comparison with the above-described structure, patterning of an insulating film was performed without forming a carbon film between a photoresist and an SiO$_2$ film. It was found that a resolution corresponding to a 0.50-$\mu$m$^2$ pattern could not obtained, and a variation in size of 0.70-$\mu$m$^2$ contact holes within the surface of a 6-inch wafer was as large as ±8.8%.

The reason for such results is as follows: The intensity of light which has passed through the photoresist 34 is decreased in the carbon film 33, so that the intensity of the light reflected by the substrate 31 or the metal wiring layer on the substrate 31 is sufficiently decreased. Therefore, even if the thickness of hate insulating film changes depending on the position, and the phase of the reflected light shift, the size of the resist pattern does not change.

According to this embodiment, therefore, the distortion of the mask pattern transferred to the photoresist 34 can be reduced, and the resolution can be increased, thus forming a stable, uniform, accurate photoresist pattern. With this photoresist, high-precision, high-reliability patterning of the SiO$_2$ film 32 can be performed.

In the second to fourth embodiments, an SiO$_2$ film exemplified as a transparent film to be processed. However, the same effect as described above can be obtained with other types of films, e.g., a silicon nitride film and a resin film. In addition, an underlying layer of a film to be processed is not limited to an Si substrate. For example, other light-reflective films, e.g., metal films such as an Al film, an Ni film, a W film, and a Cu film, metal compound films such as an Al—Si—Cu film, an Al—Si film, an MoSi$_x$ film, and a WSi$_x$ film, and metal compound wiring layers may be used.

The present invention is not limited to the above-described embodiments. For example, in the above embodiments, a carbon film is formed by the sputtering method. However, a carbon film may be formed by other film formation methods, e.g., a vacuum heating deposition method.

In the above embodiments, a positive photoresist is used. However, another photoresist material, for example, a negative photoresist may be used. The method using a negative photoresist is especially effective when the exposure area of a contact hole pattern is large.

In addition, in the above embodiments, light having a wavelength of 365 nm is used as exposure light. However, the same effect as described above can be obtained with any exposure light having a wavelength in the rang of 180 nm to 530 nm.

Various changes and modifications can be made within the spirit and scope of the invention.

As has been described in detail above, according to the present invention, since a carbon film is formed between a film to be processed and a photoresist, the intensity of light which has passed through the photoresist is decreased in the carbon film. As a result, the intensity of the reflected light of the exposure light is sufficiently reduced, and the photoresist is substantially free from abnormal exposure due to the reflected light.

Since the distortion of a pattern transferred to the photoresist can be suppressed, the film to be processed can be patterned with high precision by using the pattern of the photoresist as a mask, thus improving the reliability of the device and increasing the yield of products.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:
   forming a layer of carbon having a thickness of 38 to 78 nm on a light-reflective layer;
   forming a photosensitive resin layer on the carbon layer;
   selectively radiating light on the photosensitive resin layer;
   forming a photosensitive resin pattern by developing the photosensitive resin layer selectively irradiated with the light;
   forming a carbon pattern by etching the carbon layer using the photosensitive resin pattern as a mask; and
   forming a light-reflective pattern by etching the light-reflective layer using the carbon pattern as a mask.

2. A method according to claim 1, wherein the carbon layer has a refractive index of 1.3 to 2.5 and an extinction coefficient of 0.3 to 1.0.

3. A method according to claim 1, wherein the carbon layer is formed by sputtering.

4. A method according to claim 1, wherein the light-reflective layer essentially consists of one material selected from the group consisting of a metal, a metal alloy, a metal silicide, and a semiconductor.

5. A method according to claim 1 wherein the light-reflective layer essentially consists of one material selected from the group consisting of Al, Ag, Cu, Mo, molybdenum silicide, and polycrystalline silicon.

6. A method according to claim 1, wherein the light-reflective pattern is a wiring layer.

7. A method according to claim 1, wherein the photosensitive resin is a photoresist.

8. A method of manufacturing a semiconductor device, comprising the steps of:
   forming a transparent layer on a light-reflective layer;
   forming a layer of carbon directly on the transparent layer;
   forming a photosensitive resin layer on the carbon layer;
   selectively radiating light on the photosensitive resin layer;
   forming a photosensitive resin pattern by developing the photosensitive resin layer selectively irradiated with the light;
   forming a carbon pattern by etching the carbon layer by using the photosensitive resin pattern as a mask; and
   forming a transparent layer pattern by etching the transparent layer using the carbon pattern as a mask, so that a thickness d of the carbon layer, an extinction coefficient k of the carbon layer, and a wavelength $\lambda$ of exposure light satisfy $0.17 \leq kd/\lambda$.

9. A method according to claim 8, wherein the carbon layer has a thickness of not less than 80 nm.

10. A method according to claim 9, wherein the carbon layer has a thickness of 80 to 200 nm.

11. A method according to claim 9, wherein the carbon layer has a refractive index of 1.3 to 2.5 and an extinction coefficient of 0.3 to 1.0.

12. A method according to claim 8, wherein the carbon layer is formed by sputtering.

13. A method according to claim 8, wherein the light-reflective layer essentially consists of one material selected from the group consisting of a metal, a metal alloy, a metal silicide and, a semiconductor.

14. A method according to claim 8, wherein the light-reflective layer essentially consists of one material selected from the group consisting of Al, Ag, Cu, Mo, molybdenum silicide, and polycrystalline silicon.

15. A method according to claim 8, wherein the photosensitive resin is a photoresist.

16. A method according to claim 8, wherein the transparent layer essentially consists of one material selected from the group consisting of silicon dioxide, silicon nitride, and a synthetic resin.

17. A method according to claim 8, wherein the transparent layer pattern is an inter-layer insulating layer.

18. A method according to claim 8, wherein said light-reflective layer is a silicon substrate.

* * * * *